United States Patent
Nagatsuka et al.

(10) Patent No.: US 9,424,923 B2
(45) Date of Patent: Aug. 23, 2016

(54) SEMICONDUCTOR STORAGE DEVICE

(75) Inventors: Shuhei Nagatsuka, Kanagawa (JP); Yasuyuki Takahashi, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 736 days.

(21) Appl. No.: 13/316,607

(22) Filed: Dec. 12, 2011

(65) Prior Publication Data
US 2012/0155150 A1    Jun. 21, 2012

(30) Foreign Application Priority Data
Dec. 17, 2010 (JP) ................................. 2010-281574

(51) Int. Cl.
| | |
|---|---|
| G11C 8/00 | (2006.01) |
| G11C 16/02 | (2006.01) |
| G11C 11/404 | (2006.01) |
| H01L 27/115 | (2006.01) |
| H01L 27/12 | (2006.01) |
| G11C 8/10 | (2006.01) |

(52) U.S. Cl.
CPC .............. *G11C 16/02* (2013.01); *G11C 11/404* (2013.01); *H01L 27/1156* (2013.01); *H01L 27/1225* (2013.01); *G11C 8/10* (2013.01)

(58) Field of Classification Search
CPC ................ G11C 11/404–11/412; H01L 27/108
USPC .......................................... 365/149, 154, 191
See application file for complete search history.

(56) References Cited

U.S. PATENT DOCUMENTS

| | | |
|---|---|---|
| 4,466,081 A | 8/1984 | Masuoka |
| 5,349,366 A | 9/1994 | Yamazaki et al. |
| 5,469,402 A | 11/1995 | Yamauchi et al. |
| 5,495,444 A | 2/1996 | Okubo et al. |
| 5,610,550 A * | 3/1997 | Furutani ............. H01L 27/0218 257/371 |
| 5,731,856 A | 3/1998 | Kim et al. |

(Continued)

FOREIGN PATENT DOCUMENTS

| | | |
|---|---|---|
| EP | 0725402 A | 8/1996 |
| EP | 1 737 044 A1 | 12/2006 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Dinh
*Assistant Examiner* — Uyen B Tran
(74) *Attorney, Agent, or Firm* — Fish & Richardson P.C.

(57) ABSTRACT

A semiconductor storage device with a novel structure, which can retain stored data even when power is not supplied (i.e., is non-volatile) and has no limitation on the number of write cycles. The semiconductor storage device includes a memory cell array in which a plurality of memory cells are arranged in matrix, a decoder configured to select a memory cell to operate among the plurality of memory cells in accordance with a control signal, and a control circuit configured to select whether to output the control signal to the decoder. In each of the plurality of memory cells, data is held by turning off a selection transistor whose channel region is formed with an oxide semiconductor.

12 Claims, 25 Drawing Sheets

(56) References Cited

U.S. PATENT DOCUMENTS

| | | | |
|---|---|---|---|
| 5,744,864 A | 4/1998 | Cillessen et al. | |
| 5,748,982 A * | 5/1998 | Smith | G06F 13/4068 710/3 |
| 5,936,881 A * | 8/1999 | Kawashima et al. | 365/149 |
| 5,953,246 A | 9/1999 | Takashima et al. | |
| 6,016,268 A * | 1/2000 | Worley | 365/149 |
| 6,127,702 A | 10/2000 | Yamazaki et al. | |
| 6,294,274 B1 | 9/2001 | Kawazoe et al. | |
| 6,314,017 B1 * | 11/2001 | Emori | G11C 11/405 257/296 |
| 6,483,357 B2 | 11/2002 | Kato et al. | |
| 6,563,174 B2 | 5/2003 | Kawasaki et al. | |
| 6,727,522 B1 | 4/2004 | Kawasaki et al. | |
| 6,917,536 B1 * | 7/2005 | McLaury et al. | 365/154 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager, III et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,339,235 B1 | 3/2008 | Yamazaki et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,675,512 B2 | 3/2010 | Koyama et al. | |
| 7,714,633 B2 | 5/2010 | Kato | |
| 7,732,819 B2 | 6/2010 | Akimoto et al. | |
| 7,791,074 B2 | 9/2010 | Iwasaki | |
| 7,888,207 B2 | 2/2011 | Wager, III et al. | |
| 8,202,365 B2 | 6/2012 | Umeda et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0112652 A1 * | 6/2003 | Shimada | G11C 7/22 365/154 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 * | 3/2007 | Akimoto et al. | 438/795 |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272759 A1 | 11/2007 | Kato | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0040567 A1 * | 2/2008 | Kuroki | G11C 7/1027 711/167 |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0084742 A1 * | 4/2008 | Kozakai et al. | 365/185.05 |
| 2008/0106191 A1 | 5/2008 | Kawase | |
| 2008/0108198 A1 | 5/2008 | Wager, III et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0002590 A1 | 1/2009 | Kimura | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0190416 A1 * | 7/2009 | Hara | 365/191 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0097338 A1 | 4/2010 | Tanaka et al. | |
| 2010/0109002 A1 | 5/2010 | Itagaki et al. | |
| 2010/0148845 A1 | 6/2010 | Kato | |
| 2010/0165704 A1 * | 7/2010 | Wu et al. | 365/149 |
| 2010/0193785 A1 | 8/2010 | Kimura | |
| 2010/0203673 A1 | 8/2010 | Hayashi et al. | |
| 2011/0089414 A1 | 4/2011 | Yamazaki et al. | |

FOREIGN PATENT DOCUMENTS

| | | |
|---|---|---|
| EP | 2 226 847 A2 | 9/2010 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-029376 A | 1/1995 |
| JP | 07-134896 A | 5/1995 |
| JP | 08-241585 A | 9/1996 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-134695 A | 5/2002 |
| JP | 2002-289859 A | 10/2002 |
| JP | 2002-319682 A | 10/2002 |
| JP | 2003-086000 A | 3/2003 |

(56) References Cited

FOREIGN PATENT DOCUMENTS

| | | |
|---|---|---|
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2007-042172 A | 2/2007 |
| JP | 2009-167087 A | 7/2009 |
| TW | 200301550 | 7/2003 |
| WO | WO-2004/038757 | 5/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates, D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98. pp. 045501-1-045501-4.

Lee, H et al.. "Current Status of, Challenges to, and Perspective View of AM-OLED," IDW '06 : Proceedings of the 13th International Display Workshops, Dec. 7, 2006, pp. 663-666.

Lee, J et al., "World's Largest (15-inch) XGA AMLCD Panel Using IgZO Oxide TFT," SID Digest '08 : SID International Symposium Digest of Technical Papers, May 20, 2008, vol. 39, pp. 625-628.

Lee. M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

(56) References Cited

OTHER PUBLICATIONS

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3. 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of The 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of The 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Ishii, T et al., "A Poly-Silicon TFT With a Sub-5-nm Thick Channel for Low-Power Gain Cell Memory in Mobile Applications," IEEE Transactions on Electron Devices, Nov. 2004, vol. 51, No. 11 , pp. 1805-1810.

European Search Report (EP Application No. 11194028.4) dated May 15, 2013, 7 pages.

Taiwanese Office Action (Application No. 100145328) Dated Jun. 21, 2016.

* cited by examiner

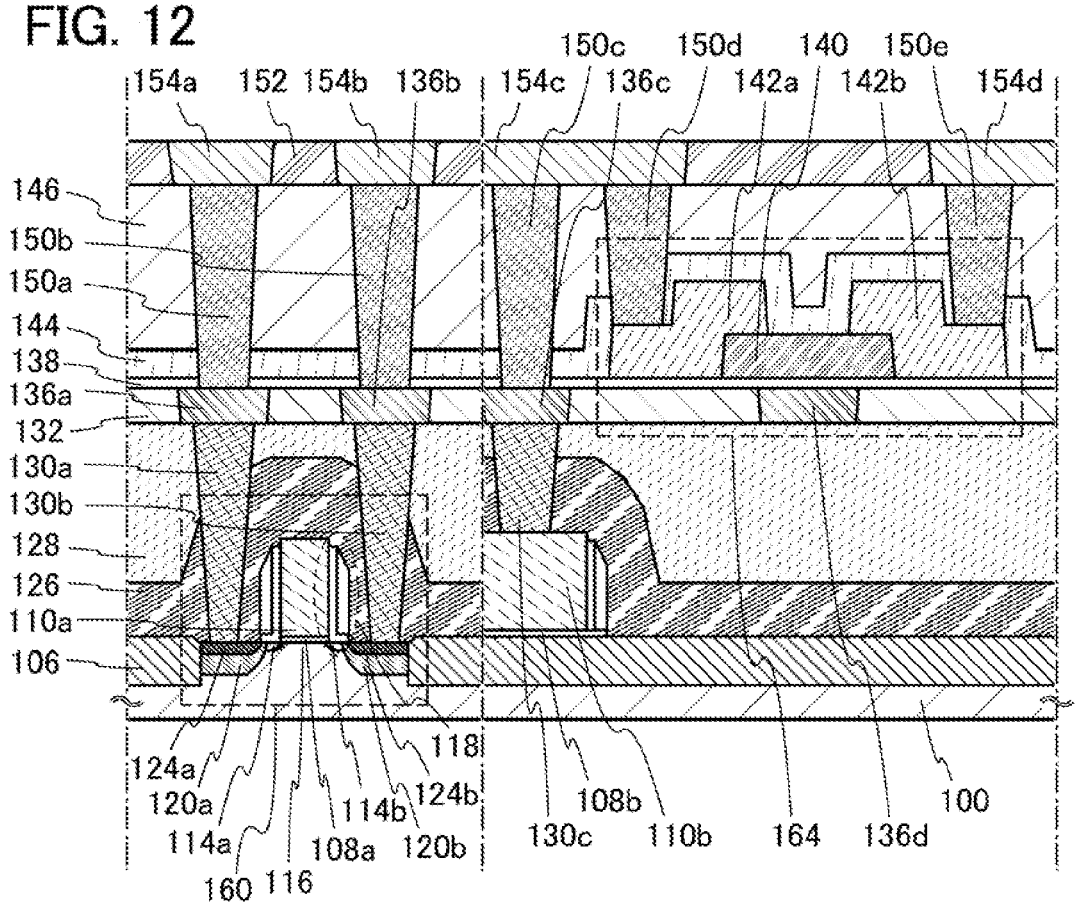

SEMICONDUCTOR STORAGE DEVICE

BACKGROUND OF THE INVENTION

1. Field of the Invention

The present invention relates to a semiconductor storage device using a semiconductor element. The present invention particularly relates to a semiconductor storage device using an element including an oxide semiconductor.

2. Description of the Related Art

Storage devices using semiconductor elements are broadly classified into two categories: a volatile device that loses stored data when power supply stops, and a non-volatile device that retains stored data even when power is not supplied.

A typical example of a volatile storage device is DRAM (dynamic random access memory). DRAM stores data in such a manner that a transistor included in a memory cell is selected and charge is stored in a capacitor.

When data is read from DRAM, charge in a capacitor is lost on the above principle; thus, another write operation is necessary every time data is read out. Moreover, since a transistor included in a memory cell has a leakage current, charge flows into or out of a capacitor even when the transistor is not selected, whereby a data retention period is short. For that reason, another write operation (refresh operation) is necessary at predetermined intervals, and it is difficult to sufficiently reduce power consumption. Furthermore, since stored data is lost when power supply stops, an additional storage device using a magnetic material or an optical material is needed in order to hold data for a long time.

Another example of a volatile storage device is SRAM (static random access memory). SRAM retains stored data by using a circuit such as a flip-flop and thus does not need a refresh operation. This means that SRAM has an advantage over DRAM. However, cost per storage capacity is increased because of the use of a flip-flop or the like. Moreover, as in DRAM, stored data in SRAM is lost when power supply stops.

A typical example of a non-volatile storage device is flash memory. Flash memory includes a floating gate between a gate electrode and a channel region in a transistor and stores data by holding charge in the floating gate. Therefore, flash memory has advantages in that the data retention time is extremely long (almost permanent) and a refresh operation which is necessary in a volatile storage device is not needed (e.g., see Patent Document 1).

However, a gate insulating film included in a memory cell deteriorates by tunneling current generated in writing, so that the memory cell stops its function after a predetermined number of write operations. In order to reduce adverse effects of this problem, a method of equalizing the number of write operations for memory cells is employed, for example, in which case a complicated peripheral circuit is needed. Moreover, employing such a method does not solve the fundamental problem of lifetime. In other words, flash memory is not suitable for applications in which data is frequently rewritten.

In addition, flash memory needs high voltage for holding charge in the floating gate or removing the charge, and a circuit for generating high voltage is also necessary. Further, it takes a relatively long time to hold or remove charge, so that it is not easy to increase the speed of write and erase operations.

REFERENCE

Patent Document 1: Japanese Published Patent Application No. S57-105889

SUMMARY OF THE INVENTION

In view of the foregoing problems, an object of one embodiment of the present invention is to provide a semiconductor storage device with a novel structure, which can retain stored data even when power is not supplied (i.e., is non-volatile) and has no limitation on the number of write cycles. Another object of one embodiment of the present invention is to provide a non-volatile semiconductor storage device that does not need high voltage for data writing. Another object of one embodiment of the present invention is to provide a non-volatile semiconductor storage device in which data rewriting errors can be suppressed even when noise is generated in wirings immediately after power supply starts, for example. Note that one embodiment of the present invention aims to achieve at least one of the above objects.

One embodiment of the present invention is a semiconductor storage device that includes a memory cell array including a plurality of memory cells arranged in matrix, a decoder configured to select a memory cell to operate among the plurality of memory cells in accordance with a control signal, and a control circuit configured to select whether to output the control signal to the decoder. In each of the plurality of memory cells, data is held by turning off a selection transistor having a channel region formed with an oxide semiconductor.

Note that the oxide semiconductor has a band gap wider than silicon and an intrinsic carrier density lower than silicon. By using such an oxide semiconductor for the channel region of the transistor, the transistor with an extremely low off-state current (leakage current) can be realized.

In addition, the oxide semiconductor is preferably an i-type (intrinsic) or substantially intrinsic oxide semiconductor (purified oxide semiconductor (purified OS)) in which the concentration of impurities such as moisture or hydrogen that might serve as electron donors (donors) has been reduced. Therefore, the off-state current (leakage current) of the transistor whose channel region is formed with an oxide semiconductor can be further reduced. Specifically, the oxide semiconductor has a hydrogen concentration of $5 \times 10^{19}$ (atoms/cm$^3$) or less, preferably $5 \times 10^{18}$ (atoms/cm$^3$) or less, further preferably $5 \times 10^{17}$ (atoms/cm$^3$) or less when the hydrogen concentration is measured by secondary ion mass spectrometry (SIMS). The carrier density of the oxide semiconductor measured by Hall effect measurement is less than $1 \times 10^{14}$/cm$^3$, preferably less than $1 \times 10^{12}$/cm$^3$, further preferably less than $1 \times 10^{11}$/cm$^3$. The band gap of the oxide semiconductor is 2 eV or more, preferably 2.5 eV or more, further preferably 3 eV or more.

Here, analysis of the hydrogen concentration by secondary ion mass spectrometry (SIMS) is mentioned. It is known to be difficult to accurately obtain data in the proximity of a surface of a sample or in the proximity of an interface between stacked films formed using different materials by the SIMS analysis in principle. Thus, in the case where distributions of the hydrogen concentrations of the film in the thickness direction are analyzed by SIMS, an average value in a region of the film where the value is not greatly changed and almost the same value can be obtained is employed as the hydrogen concentration. Further, in the case where the thickness of the film to be measured is small, a region where almost the same value can be obtained cannot be found in some cases because of the influence of the hydrogen concentration of the films adjacent to each other. In that case, the maximum value or the minimum value of the hydrogen concentration of a region where the films are provided is employed as the hydrogen concentration of the film. Furthermore, in the case where a mountain-shaped peak having the maximum value and a valley-shaped peak having the minimum value do not exist in the region where the films are provided, the value of the inflection point is employed as the hydrogen concentration.

Examples of the oxide semiconductor are an In—Sn—Ga—Zn—O-based oxide semiconductor which is an oxide of four metal elements; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor which are oxides of three metal elements; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, and an In—Ga—O-based oxide semiconductor which are oxides of two metal elements; and an In—O-based oxide semiconductor, a Sn—O-based oxide semiconductor, and a Zn—O-based oxide semiconductor. Note that in this specification, for example, an In—Sn—Ga—Zn—O-based oxide semiconductor means a metal oxide containing indium (In), tin (Sn), gallium (Ga), and zinc (Zn), and there is no particular limitation on the composition ratio. The above oxide semiconductor may contain silicon.

Further, in this specification, an oxide semiconductor can be represented by the chemical formula, $InMO_3(ZnO)_m$ (m>0), for example. Here, M represents one or more metal elements selected from Ga, Al, Mn, and Co.

In the semiconductor storage device according to one embodiment of the present invention, data is stored by turning off a selection transistor whose channel region is formed with an oxide semiconductor in each of a plurality of memory cells. Thus, stored data can be retained for a long time even when power is not supplied (note that the potentials of wirings are preferably fixed).

Further, the semiconductor storage device according to one embodiment of the present invention does not need high voltage for writing data, and there is no problem of degradation of the element. For example, unlike a conventional non-volatile memory, it is not necessary to inject and extract electrons into and from a floating gate; thus, the problem of deterioration of a gate insulating film does not occur. That is, the semiconductor storage device according to one embodiment of the present invention does not have a limitation on the number of rewrite cycles, which has been a problem of a conventional non-volatile memory, and thus has significantly improved reliability. Furthermore, since data is written by switching of the transistor, high-speed operation can be easily realized. In addition, the semiconductor storage device has an advantage of not needing an operation for erasing data.

Moreover, the semiconductor storage device according to one embodiment of the present invention includes a control circuit that selects whether to output a control signal to a decoder for selecting a desired memory cell. Consequently, malfunction of the decoder can be suppressed even when noise is generated in wirings at the time of turning on the power, for example. Thus, data rewriting errors can be suppressed.

BRIEF DESCRIPTION OF THE DRAWINGS

In the accompanying drawings.

FIG. 12 illustrates a specific example of a transistor.

DETAILED DESCRIPTION OF THE INVENTION

Embodiments of the present invention will be hereinafter described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be limited to the descriptions of the embodiments below.

First, a semiconductor storage device according to one embodiment of the present invention will be described with reference to FIGS. 1A and 1B, FIGS. 2A to 2H, FIGS. 3A to 3C, FIGS. 4A and 4B, FIG. 5, FIG. 6, FIG. 7, and FIG. 8.

<Structure Example of Semiconductor Storage Device>

Figure 1A:
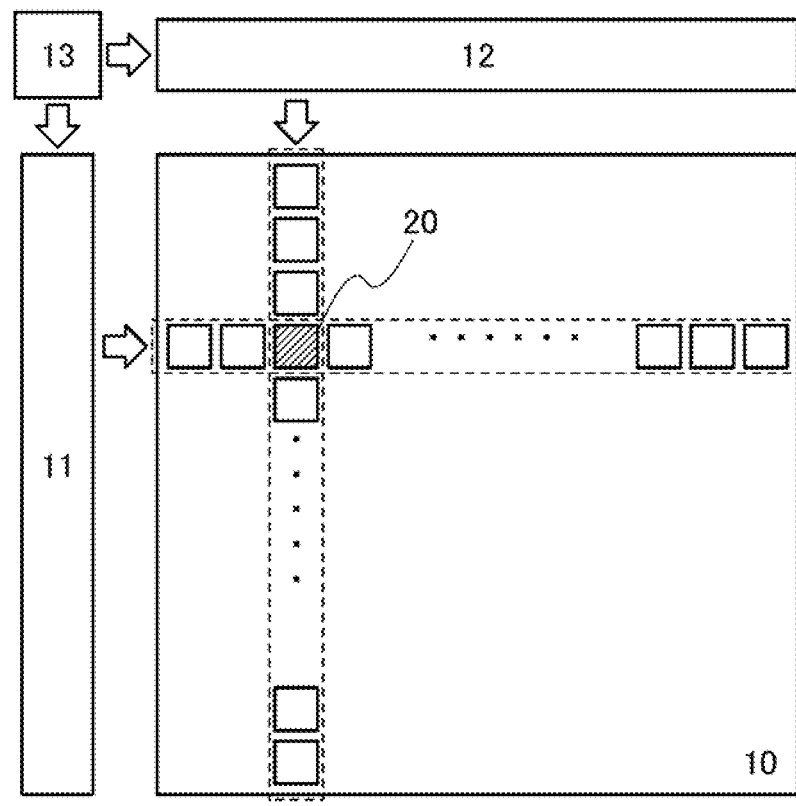
FIGS. 1A and 1B illustrate a structure example of a semiconductor storage device.

FIG. 1A illustrates an example of the structure of a semiconductor storage device. The semiconductor storage device in FIG. 1A includes a memory cell array 10 in which a plurality of memory cells 20 are arranged in matrix, a row decoder 11 that selects a given row of the memory cell array 10, a column decoder 12 that selects a given column of the memory cell array 10, and a control circuit 13 that selects whether to output a control signal such as an address signal, a read enable signal, or a write enable signal to the row decoder 11 and the column decoder 12.

In the semiconductor storage device in FIG. 1A, a given memory cell 20 (the shaded memory cell 20 in FIG. 1A) is selected by selecting a given row and a given column by the row decoder 11 and the column decoder 12 in accordance with a control signal, and a data write operation or a data read operation is performed in the selected memory cell 20.

Figure 1B:
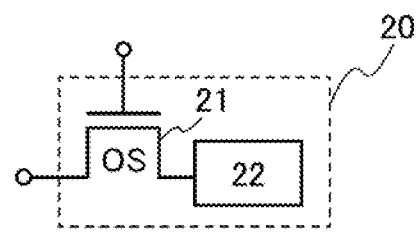

FIG. 1B illustrates an example of the structure of the memory cell 20 included in the semiconductor storage device illustrated in FIG. 1A. The memory cell 20 illustrated in FIG. 1B includes a transistor 21 whose channel region is formed with an oxide semiconductor (OS) and a circuit 22 including a node that is brought into a floating state when the transistor 21 is turned off. In the memory cell 20, charge can be held in the node, and the value of the potential of the node can correspond to two-level or multilevel data.

The node is electrically connected to one of a source and a drain of the transistor 21. Thus, the potential of the node can be easily controlled by transfer of charge through the transistor 21. Accordingly, the memory cell 20 can be easily used as a multi-level cell that can store more than one bit of data.

Further, data stored in the node is less affected by a specific semiconductor element than in flash memory and the like described above. In other words, the memory cell 20 can store data without largely depending on variations in characteristics of semiconductor elements. Consequently, the potential of the node can be divided into multiple sections to be used as data stored in the memory cell 20. For example, data to be stored in the memory cell 20 can have four levels by setting the potentials of the node at 0 V, 0.25 V, 0.5 V, and 0.75 V instead of 0 V, 1 V, 2 V, and 3 V.

<Off-State Current of Transistor Whose Channel Region is Formed with Oxide Semiconductor>

The results of measuring the off-state current (leakage current) of a transistor whose channel region is formed with an oxide semiconductor will be described.

First, a method for fabricating a transistor used for the measurement will be described with reference to FIGS. 2A to 2H.

Figure 2A:
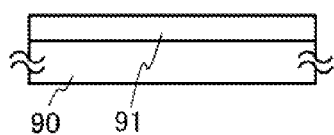
FIGS. 2A to 2H illustrate an example of a method for fabricating a transistor.
Figure 2B:
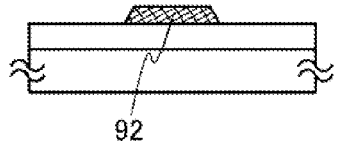

First, a base layer 91 formed of a stack of a 100-nm-thick silicon nitride layer and a 150-nm-thick silicon oxynitride layer was formed by CVD over a glass substrate 90 (see FIG. 2A).

Next, a 100-nm-thick tungsten layer was formed by sputtering over the base layer 91. Then, the tungsten layer was selectively etched by photolithography to form a gate layer 92 (see FIG. 2B).

Figure 2C:
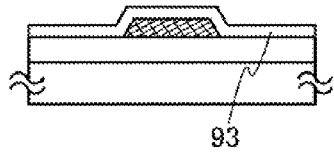
Figure 2D:
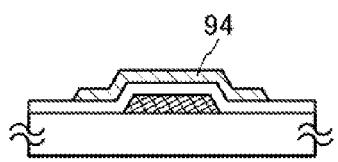
Figure 2E:
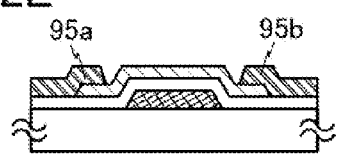
Figure 2F:
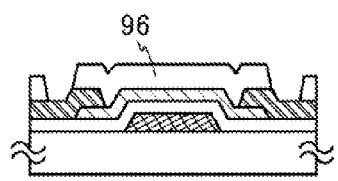

Next, a gate insulating film 93 made of a 100-nm-thick silicon oxynitride layer was formed by CVD over the base layer 91 and the gate layer 92 (see FIG. 2C).

Then, a 25-nm-thick oxide semiconductor layer was formed by sputtering over the gate insulating film 93. A metal oxide target having a composition ratio of $In_2O_3$:$Ga_2O_3$:$ZnO$=1:1:2 [molar ratio] was used for forming the oxide semiconductor layer. In addition, the oxide semiconductor layer was formed under the following conditions: the substrate temperature was 200° C., the internal pressure of the chamber was 0.6 Pa, the direct-current power was 5 kW, and the atmosphere was a mixed atmosphere of oxygen and argon (the oxygen flow rate was 50 sccm and the argon flow rate was 50 sccm). Then, the oxide semiconductor layer was selectively etched by photolithography, so that an oxide semiconductor layer 94 was formed (see FIG. 2D).

Subsequently, heat treatment was performed at 450° C. for one hour in a mixed atmosphere of nitrogen and oxygen (the percentage of nitrogen is 80% and that of oxygen is 20%).

Then, the gate insulating film 93 was selectively etched by photolithography (not illustrated). Note that this etching is a step for forming a contact hole for connecting the gate layer 92 and a conductive layer to be formed.

Next, a stack of a 100-nm-thick titanium layer, a 200-nm-thick aluminum layer, and a 100-nm-thick titanium layer was formed by sputtering over the gate insulating film 93 and the oxide semiconductor layer 94. Then, the stack was selectively etched by photolithography, so that a source layer 95a and a drain layer 95b were formed (see FIG. 2E).

Then, heat treatment was performed at 300° C. for one hour in a nitrogen atmosphere.

Next, a protective insulating layer 96 made of a 300-nm-thick silicon oxide layer was formed over the gate insulating film 93, the oxide semiconductor layer 94, the source layer 95a, and the drain layer 95b. Then, the protective insulating layer 96 was selectively etched by photolithography (see FIG. 2F). Note that this etching is a step for forming a contact hole for connecting the gate layer, the source layer, and the drain layer and the conductive layer to be formed.

Figure 2G:
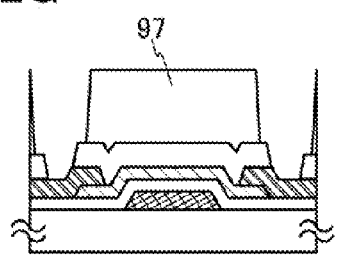
Figure 2H:
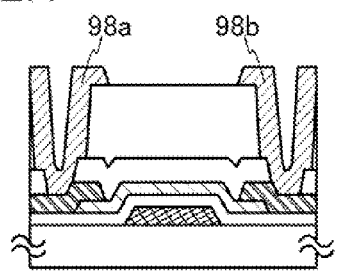

Next, a 1.5-μm-thick acrylic layer was applied over the protective insulating layer 96 and selectively exposed to light, so that a planarization insulating layer 97 was formed (see FIG. 2G). Then, the planarization insulating layer 97 formed of the acrylic layer was baked with heat treatment at 250° C. for one hour in a nitrogen atmosphere.

Subsequently, a 200-nm-thick titanium layer was formed by sputtering over the planarization insulating layer 97. Then, the titanium layer was selectively etched by photolithography, thereby forming a conductive layer (not illustrated) connected to the gate layer 92, a conductive layer 98a connected to the source layer 95a, and a conductive layer 98b connected to the drain layer 95b (see FIG. 2H).

Next, heat treatment was performed at 250° C. for one hour in a nitrogen atmosphere.

Through the above steps, the transistor used for the measurement was formed.

Next, a method for calculating the value of off-state current by using a circuit for evaluating characteristics, used in the measurement, will be described below.

Figure 3A:
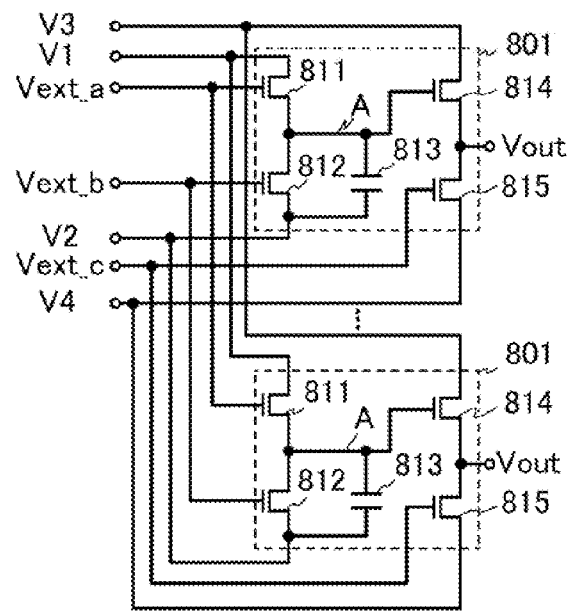
FIGS. 3A to 3C are diagrams for explaining a method for measuring off-state current of a transistor.
Figure 3B:
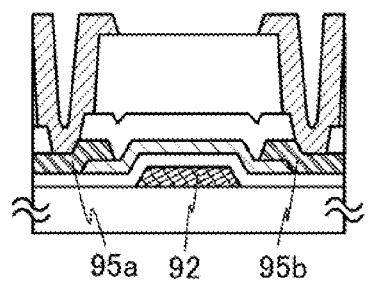
Figure 3C:
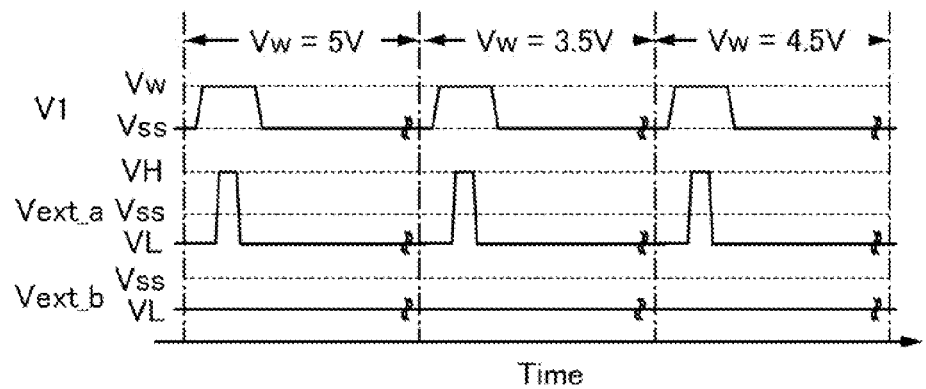

Current measurement using a circuit for evaluating characteristics will be described with reference to FIGS. 3A to 3C. FIGS. 3A to 3C are diagrams for explaining a circuit for evaluating characteristics.

First, the configuration of a circuit for evaluating characteristics is described with reference to FIG. 3A. FIG. 3A is a circuit diagram illustrating the configuration of the circuit for evaluating characteristics.

The circuit for evaluating characteristics illustrated in FIG. 3A includes a plurality of measurement systems 801. The plurality of measurement systems 801 are connected in parallel with each other. Here, eight measurement systems 801 are connected in parallel with each other. By using the plurality of measurement systems 801, a plurality of leakage currents can be measured at the same time.

The measurement system 801 includes a transistor 811, a transistor 812, a capacitor 813, a transistor 814, and a transistor 815.

The transistors 811, 812, 814, and 815 are n-channel field effect transistors.

A voltage V1 is input to one of a source and a drain of the transistor 811. A voltage Vext_a is input to a gate of the transistor 811. The transistor 811 is a transistor for injecting charge.

One of a source and a drain of the transistor 812 is connected to the other of the source and the drain of the transistor 811. A voltage V2 is input to the other of the source and the drain of the transistor 812. A voltage Vext_b is input to a gate of the transistor 812. The transistor 812 is a transistor for evaluating leakage current. Note that the term "leakage current" here refers to a leakage current including an off-state current of the transistor.

One electrode of the capacitor 813 is connected to the other of the source and the drain of the transistor 811. The voltage V2 is input to the other electrode of the capacitor 813. Here, the voltage V2 is 0 V.

A voltage V3 is input to one of a source and a drain of the transistor 814. A gate of the transistor 814 is connected to the other of the source and the drain of the transistor 811. Note that a portion where the gate of the transistor 814, the other of the source and the drain of the transistor 811, the one of the source and the drain of the transistor 812, and the one electrode of the capacitor 813 are connected to each other is referred to as a node A. Here, the voltage V3 is 5 V.

One of a source and a drain of the transistor 815 is connected to the other of the source and the drain of the transistor 814. A voltage V4 is input to the other of the source and the drain of the transistor 815. A voltage Vext_c is input to a gate of the transistor 815. Here, the voltage Vext_c is 0.5 V.

The measurement system 801 outputs a voltage at a portion where the other of the source and the drain of the transistor 814 is connected to the one of the source and the drain of the transistor 815, as an output voltage Vout.

Here, as the transistor 811, a transistor that is formed by the fabrication method described with reference to FIGS. 2A to 2H and has a channel length L of 10 μm and a channel width W of 10 μm is used.

As the transistors 814 and 815, a transistor that is formed by the fabrication method described with reference to FIGS. 2A to 2H and has a channel length L of 3 μm and a channel width W of 100 μm is used.

At least the transistor 812 includes a 1-μm-wide offset region in which the gate layer 92 does not overlap with the source layer 95a and the drain layer 95b as illustrated in FIG. 3B. By providing the offset region, parasitic capacitance can be reduced. Further, as the transistor 812, six samples (SMP) of transistors having different channel lengths L and channel widths W are used (see Table 1).

TABLE 1

|  | L[μm] | W[μm] |
|---|---|---|
| SMP1 | 1.5 | $1 \times 10^5$ |
| SMP2 | 3 | $1 \times 10^5$ |
| SMP3 | 10 | $1 \times 10^5$ |
| SMP4 | 1.5 | $1 \times 10^6$ |
| SMP5 | 3 | $1 \times 10^6$ |
| SMP6 | 10 | $1 \times 10^6$ |

The transistor for injecting charge and the transistor for evaluating leakage current are separately provided as illustrated in FIG. 3A, so that the transistor for evaluating leakage current can be always kept off while charge is injected.

In addition, the transistor for injecting charge and the transistor for evaluating leakage current are separately provided, whereby each transistor can have an appropriate size. When the channel width W of the transistor for evaluating leakage current is made larger than that of the transistor for injecting charge, leakage current components of the circuit for evaluating characteristics other than the leakage current of the transistor for evaluating leakage current can be made relatively small. As a result, the leakage current of the transistor for evaluating leakage current can be measured with high accuracy. Moreover, since the transistor for evaluating leakage current does not need to be turned on at the time of charge injection, the measurement is not adversely affected by variation in the voltage of the node A, which is caused when part of charge in the channel region flows into the node A.

Next, a method for measuring a leakage current of the circuit for evaluating characteristics illustrated in FIG. 3A will be described with reference to FIG. 3C. FIG. 3C is a timing chart for explaining the method for measuring a leakage current with the use of the circuit for evaluating characteristics illustrated in FIG. 3A.

In the method for measuring the leakage current with the circuit for evaluating characteristics illustrated in FIG. 3A, a write period and a retention period are provided. The operation in each period is described below.

In the write period, a voltage VL (−3 V) with which the transistor 812 is turned off is input as the voltage Vext_b. Moreover, a write voltage Vw is input as the voltage V1, and then, a voltage VH (5 V) with which the transistor 811 is turned on is input as the voltage Vext_a for a given period of time. Thus, charge is accumulated in the node A, and the voltage of the node A becomes equivalent to the write voltage Vw. Then, the voltage VL with which the transistor 811 is turned off is input as the voltage Vext_a. After that, a voltage VSS (0 V) is input as the voltage V1.

In the retention period, the amount of change in the voltage of the node A, which is caused by change in the amount of the charge held in the node A, is measured. From the amount of change in the voltage, the value of the current flowing between the source and the drain of the transistor 812 can be calculated. In the above manner, charge can be accumulated in the node A, and the amount of change in the voltage of the node A can be measured.

Accumulation of charge in the node A and measurement of the amount of change in the voltage of the node A (also referred to as an accumulation and measurement operation) are repeatedly performed. First, a first accumulation and measurement operation is repeated 15 times. In the first accumulation and measurement operation, a voltage of 5 V is input as the write voltage Vw in the write period and retained for 1 hour in the retention period. Next, a second accumulation and measurement operation is repeated twice. In the second accumulation and measurement operation, a voltage of 3.5 V is input as the write voltage Vw in the write period and retained for 50 hours in the retention period. Then, a third accumulation and measurement operation is performed once. In the third accumulation and measurement operation, a voltage of 4.5 V is input as the write voltage Vw in the write period and retained for 10 hours in the retention period. By repeating the accumulation and measurement operation, the measured current value can be confirmed to be the value in the steady state. In other words, the transient current (a current component that decreases over time after the measurement starts) can be removed from a current $I_A$ flowing through the node A. Consequently, the leakage current can be measured with higher accuracy.

In general, a voltage $V_A$ of the node A is expressed as a function of the output voltage Vout by Formula 1.

[Formula 1]

$$V_A = F(Vout) \quad (1)$$

Charge $Q_A$ of the node A is expressed by Formula 2, using the voltage $V_A$ of the node A, capacitance $C_A$ connected to the node A, and a constant (const). Here, the capacitance $C_A$ connected to the node A is the sum of the capacitance of the capacitor 813 and a capacitance other than that of the capacitor 813.

[Formula 2]

$$Q_A = C_A V_A + \text{const} \quad (2)$$

Since the current $I_A$ of the node A is the time differential of charge flowing into the node A (or charge flowing from the node A), the current $I_A$ of the node A is expressed by Formula 3.

[Formula 3]

$$I_A = \frac{\Delta Q_A}{\Delta t} = \frac{C_A \cdot \Delta F(Vout)}{\Delta t} \quad (3)$$

Here, Δt is about 54000 seconds. As above, the current $I_A$ of the node A, which is the leakage current, can be calculated with the capacitance $C_A$ connected to the node A and the output voltage Vout, so that the leakage current of the circuit for evaluating characteristics can be obtained.

Next, the results of measuring the output voltage by the measurement method using the above circuit for evaluating characteristics and the value of the leakage current of the circuit for evaluating characteristics, which is calculated from the measurement results, will be described with reference to FIGS. 4A and 4B.

Figure 4A:
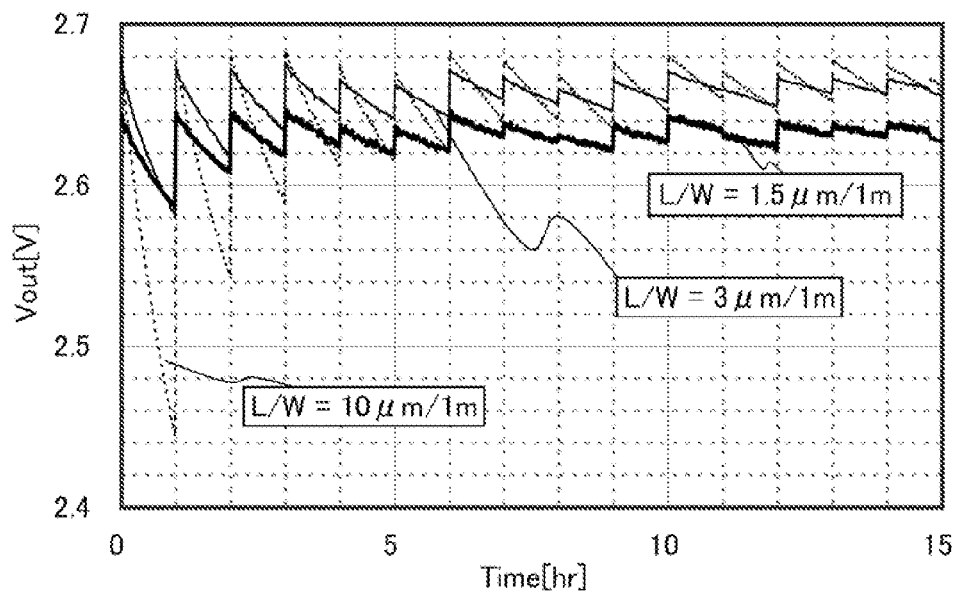
FIGS. 4A and 4B show characteristics of transistors.
Figure 4B:
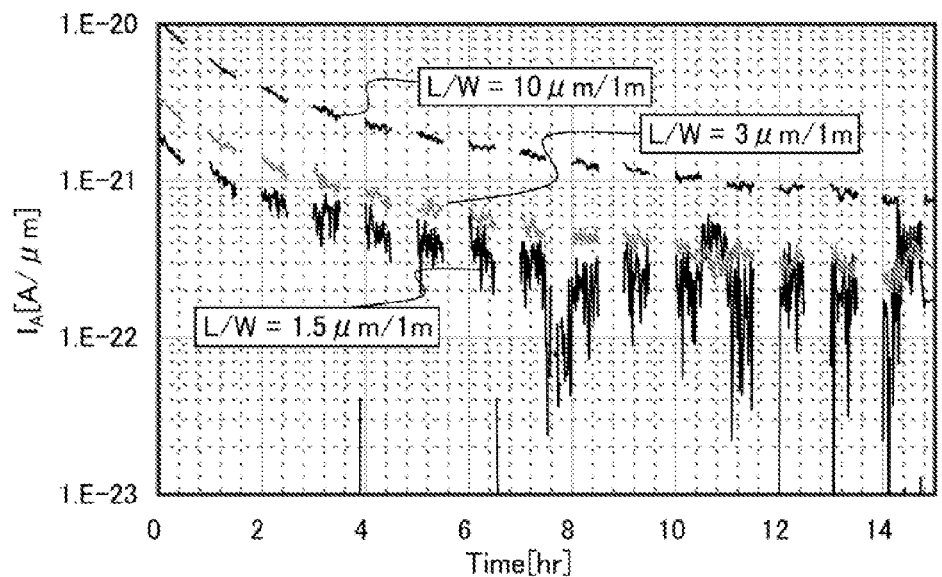

FIG. 4A shows the relation between the elapsed time Time of the above measurement (the first accumulation and measurement operation) of the transistors SMP4, SMP5, and SMP6 and the output voltage Vout. FIG. 4B shows the relation between the elapsed time Time of the above measurement and the current $I_A$ calculated by the measurement. It is found that the output voltage Vout varies after the measurement starts and it takes 10 hours or longer to reach a steady state.

Figure 5:
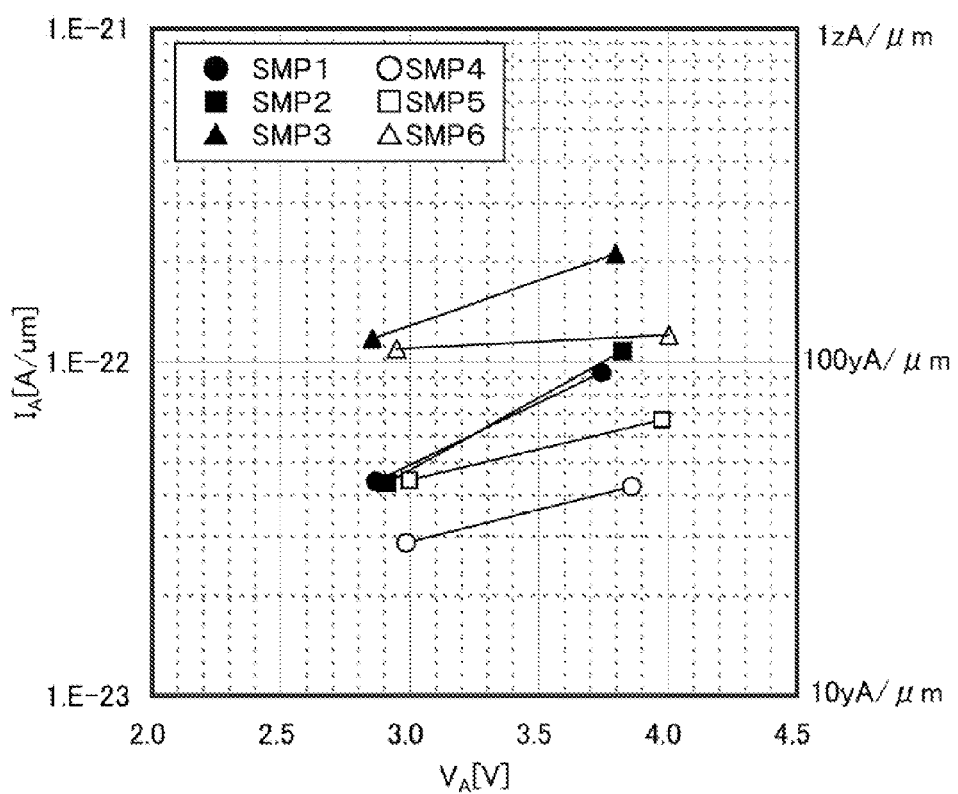
FIG. 5 shows characteristics of transistors.

FIG. 5 shows the relation between the voltage of the node A in SMP1 to SMP6 and the leakage current estimated by the above measurement. In SMP4 in FIG. 5, for example, when the voltage of the node A is 3.0 V, the leakage current (per unit channel width (1 μm) here) is 28 yA/μm. Since the leakage current includes the off-state current of the transistor 812, the off-state current of the transistor 812 can be considered to be 28 yA/μm or less.

Figure 6:
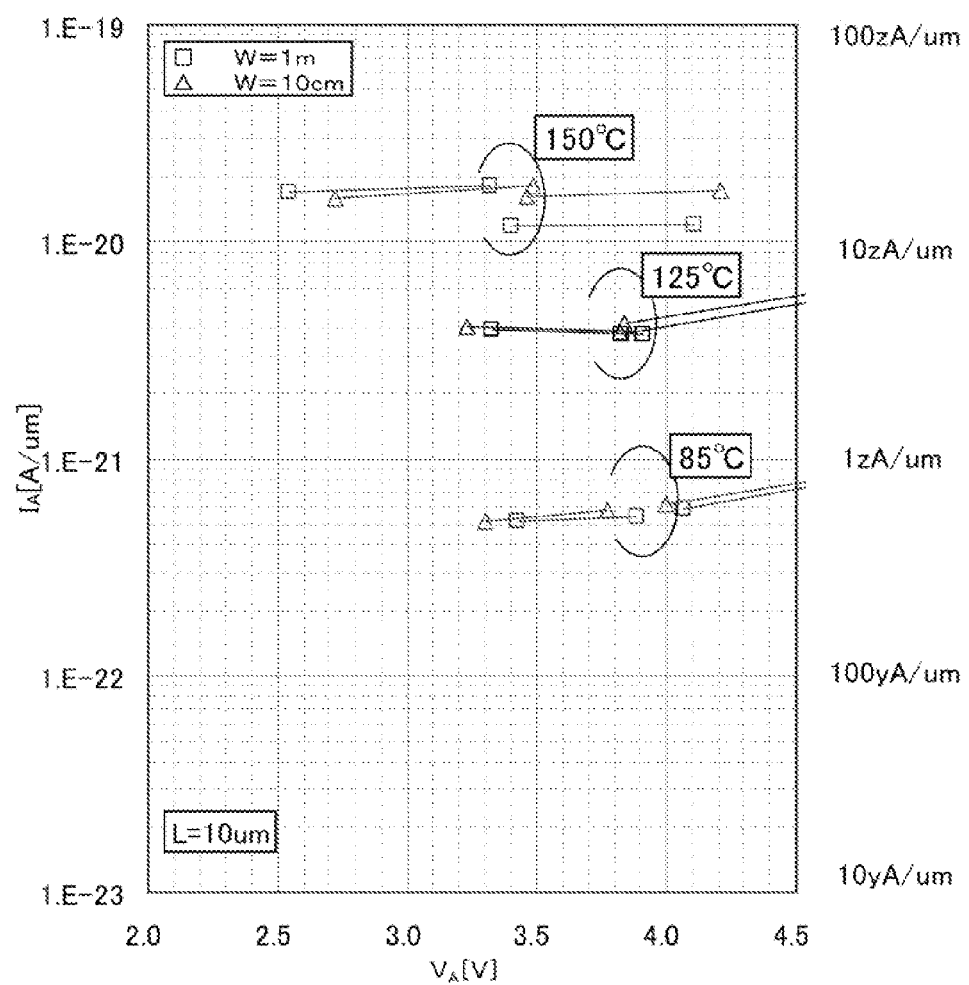
FIG. 6 shows characteristics of transistors.
Figure 7:
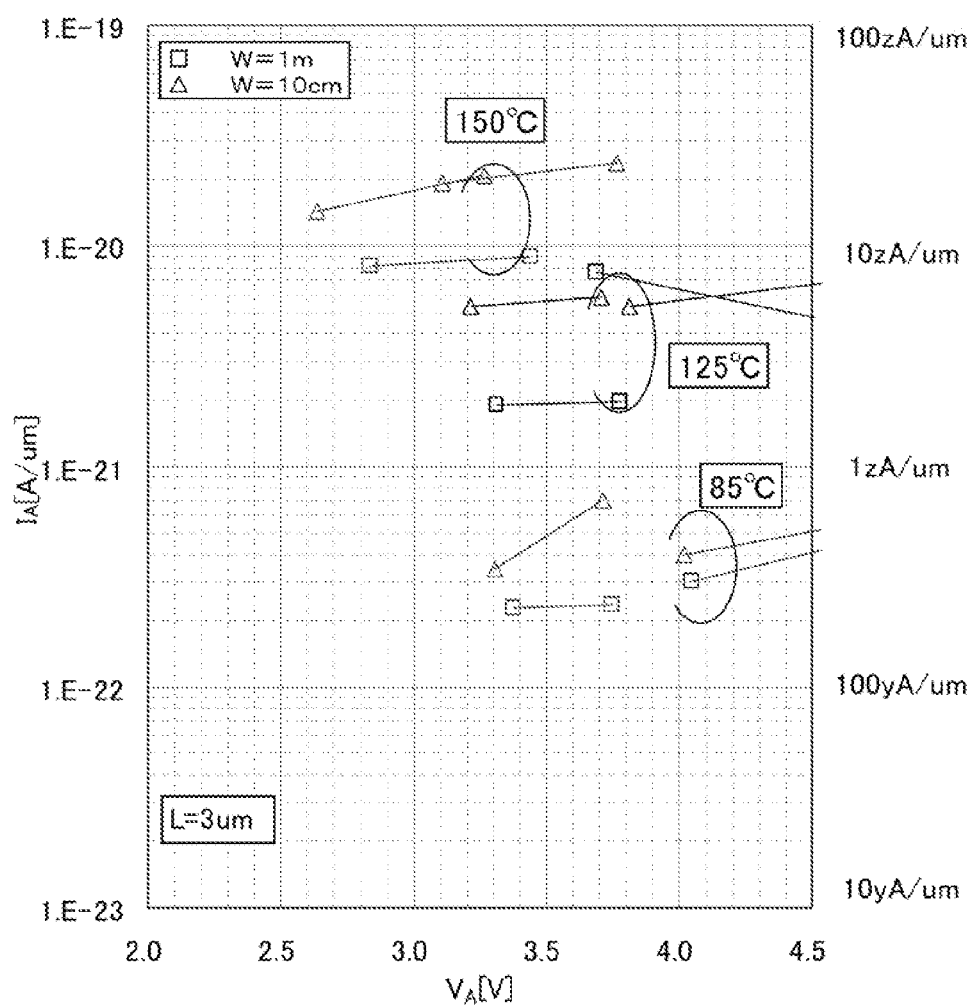
FIG. 7 shows characteristics of transistors.
Figure 8:
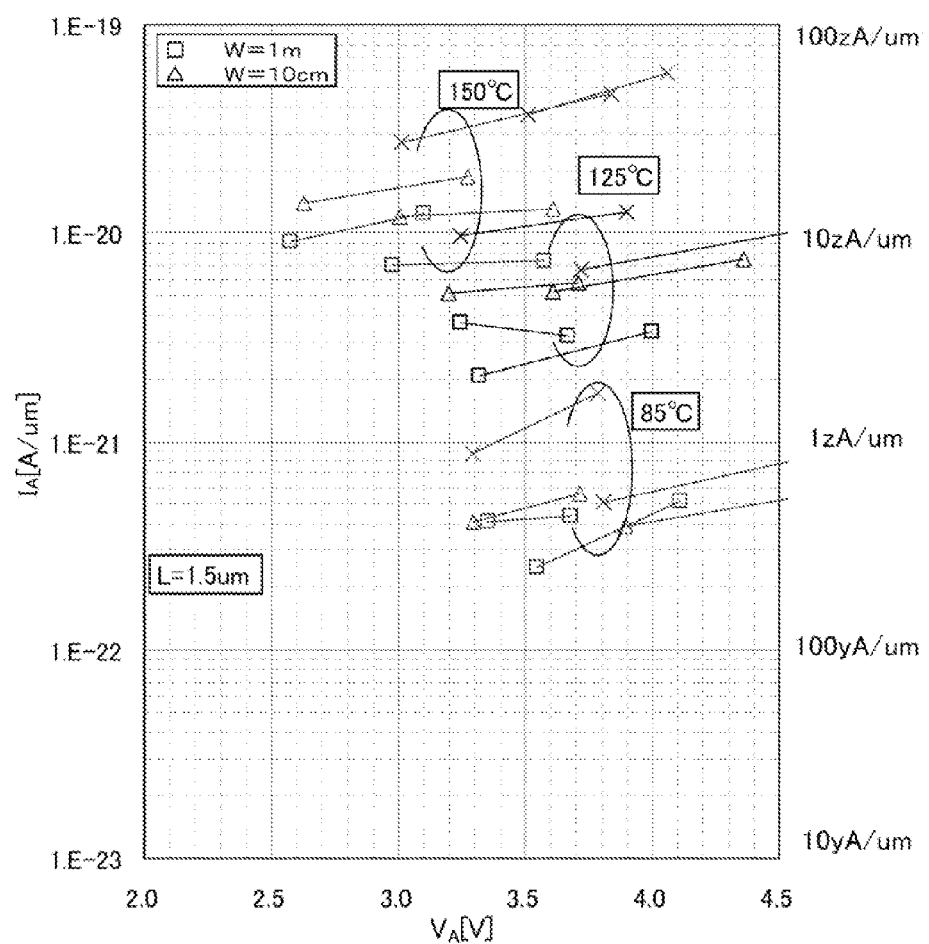
FIG. 8 shows characteristics of transistors.

FIG. 6, FIG. 7, and FIG. 8 each show the relation between the voltage of the node A in SMP1 to SMP6 at 85° C., 125° C., and 150° C. and the leakage current estimated by the above measurement. As shown in FIGS. 6 to 8, the leakage current is 100 zA/μm or less even at 150° C.

As described above, the leakage current is sufficiently low in the circuit for evaluating characteristics, which includes the transistor whose channel region is formed with an oxide semiconductor. This means that the off-state current of the transistor is sufficiently low. In addition, the off-state current of the transistor is sufficiently low even when the temperature rises.

<Semiconductor Storage Device Disclosed in this Specification>

In the semiconductor storage device disclosed in this specification, data is stored by turning off a selection transistor whose channel region is formed with an oxide semiconductor in each of a plurality of memory cells. Thus, stored data can be retained for a long time even when power is not supplied (note that the potentials of wirings are preferably fixed).

Further, the semiconductor storage device disclosed in this specification does not need high voltage for writing data, and there is no problem of degradation of the element. For example, unlike a conventional non-volatile memory, it is not necessary to inject and extract electrons into and from a floating gate; thus, the problem of deterioration of a gate insulating film does not occur. That is, the semiconductor storage device disclosed in this specification does not have a limitation on the number of rewrite cycles, which has been a problem of a conventional non-volatile memory, and thus has significantly improved reliability. Furthermore, since data is written by switching of the transistor, high-speed operation can be easily realized. In addition, the semiconductor storage device has an advantage of not needing an operation for erasing data.

Moreover, the semiconductor storage device disclosed in this specification includes a control circuit that selects whether to output a control signal to a decoder for selecting a desired memory cell. Consequently, malfunction of the decoder can be suppressed even when noise is generated in wirings at the time of turning on the power, for example. Thus, data rewriting errors can be suppressed.

<Specific Example>

Specific examples of the above-described semiconductor storage device will be described with reference to FIGS. 9A to 9C, FIGS. 10A to 10D, FIGS. 11A and 11B, FIG. 12, FIGS. 13A to 13H, FIGS. 14A to 14G, FIGS. 15A to 15D, FIG. 16, FIGS. 17A and 17B, FIGS. 18A and 18B, FIGS. 19A and 19B, FIG. 20, FIG. 21, and FIGS. 22A to 22C.

<First Specific Example of Memory Cell 20>

Figure 9A:
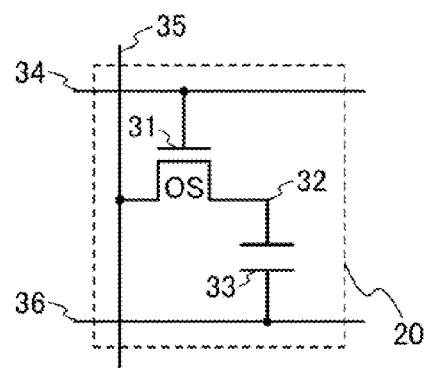
FIGS. 9A to 9C are circuit diagrams each illustrating a specific example of a memory cell.

FIG. 9A is a circuit diagram illustrating a specific example of the memory cell 20. The memory cell 20 illustrated in FIG. 9A includes a transistor 31 and a capacitor 33. A gate of the transistor 31 is electrically connected to a word line 34. One of a source and a drain of the transistor 31 is electrically connected to a bit line 35. One electrode of the capacitor 33 is electrically connected to the other of the source and the drain of the transistor 31. The other electrode of the capacitor 33 is electrically connected to a wiring 36 that supplies a fixed potential. In the memory cell 20 in FIG. 9A, data is stored in a node 32 where the other of the source and the drain of the transistor 31 and the one electrode of the capacitor 33 are electrically connected to each other. As the fixed potential, a ground potential (GND), 0 V, or the like can be employed.

In the memory cell 20 in FIG. 9A, the value of the potential of the node 32 can correspond directly to two-level or multi-level data. Specifically, the potential of the bit line 35 at the time of reading during which the transistor 31 is on varies depending on the amount of charge held in the capacitor 33; therefore, data held in the memory cell 20 can be judged from the value of the potential of the bit line at the time of reading.

<Second Specific Example of Memory Cell 20>

Figure 9B:
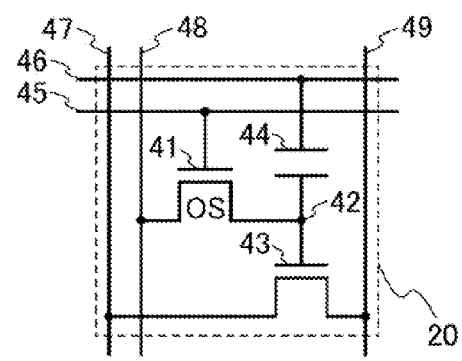

FIG. 9B is a circuit diagram illustrating a specific example of the memory cell 20, which is different from that in FIG. 9A. The memory cell 20 illustrated in FIG. 9B includes a transistor 41, a transistor 43, and a capacitor 44. A gate of the transistor 41 is electrically connected to a writing word line 45. One of a source and a drain of the transistor 41 is electrically connected to a writing bit line 48. A gate of the transistor 43 is electrically connected to the other of the source and the drain of the transistor 41. One of a source and a drain of the transistor 43 is electrically connected to a reading bit line 47. The other of the source and the drain of the transistor 43 is electrically connected to a wiring 49 that supplies a fixed potential. One electrode of the capacitor 44 is electrically connected to the other of the source and the drain of the transistor 41 and the gate of the transistor 43. The other electrode of the capacitor 44 is electrically connected to a reading word line 46. In the memory cell 20 in FIG. 9B, data is stored in a node 42 where the other of the source and the drain of the transistor 41, the gate of the transistor 43, and the one electrode of the capacitor 44 are electrically connected to each other. As the fixed potential, a ground potential (GND), 0 V, or the like can be employed. Further, the transistor 41 is a transistor whose channel region is formed with an oxide semiconductor (OS). On the other hand, there is no particular limitation on the semiconductor material for a channel region of the transistor 43.

In the memory cell 20 illustrated in FIG. 9B, switching of the transistor 43 can be controlled in accordance with the potential of the node 42. In addition, the potential of the node 42 can be controlled by capacitive coupling with the reading word line 46. Thus, multilevel data can be stored in the memory cell 20 in FIG. 9B. By judging the conduction state (the on state or the off state) of the transistor 43 under a plurality of conditions with different potentials of the reading word line 46, data can be read out even when the potential of the node 42 is a multivalued potential. Note that data can be read out by, for example, judging an output signal of a voltage divider circuit constituted by the transistor 43. Further, the memory cell 20 in FIG. 9B can also be used as a memory cell that retains binary data.

<Third Specific Example of Memory Cell 20>

Figure 9C:
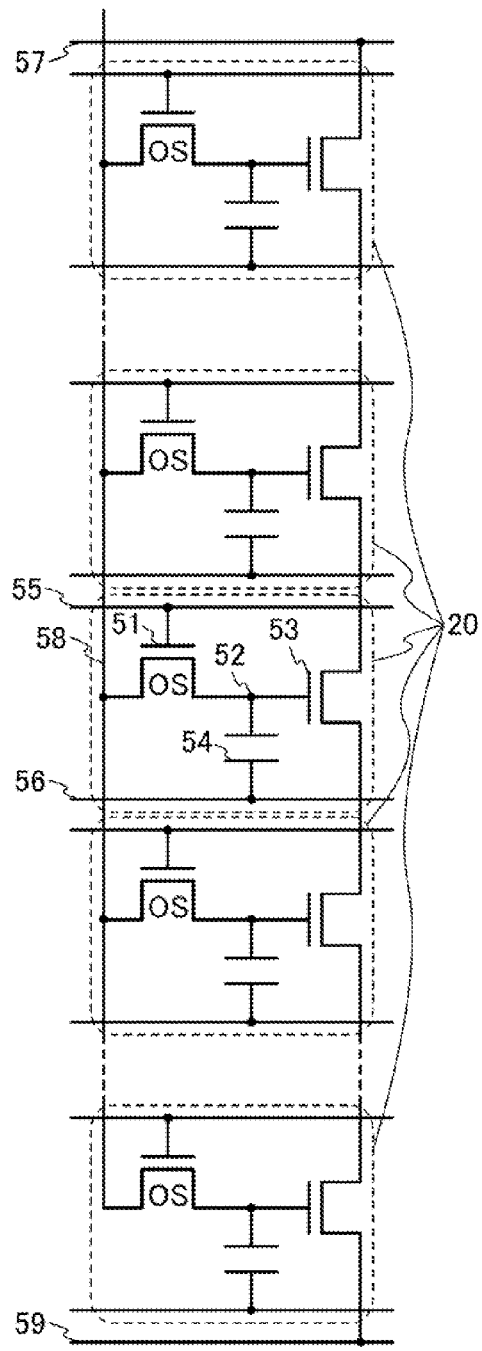

FIG. 9C is a circuit diagram illustrating a specific example of the memory cell 20, which is different from the examples in FIGS. 9A and 9B. The memory cell 20 in FIG. 9C is one of n memory cells arranged in one column. The memory cell 20 includes a transistor 51, a transistor 53, and a capacitor 54. A gate of the transistor 51 is electrically connected to a writing word line 55. One of a source and a drain of the transistor 51 is electrically connected to a writing bit line 58. A gate of the transistor 53 is electrically connected to the other of the source and the drain of the transistor 51. One electrode of the capacitor 54 is electrically connected to the other of the source and the drain of the transistor 51 and the gate of the transistor 53. The other electrode of the capacitor 54 is electrically connected to a reading word line 56. In addition, one of the source and the drain of the transistor 53 in the k-th memory cell 20 (k is a natural number greater than or equal to 2 and less than n) is electrically connected to the other of the source and the drain of the transistor 53 in the (k−1)th memory cell 20. The other of the source and the drain of the transistor 53 in the k-th memory cell 20 is electrically connected to one of the source and the drain of the transistor 53 in the (k+1)th memory cell 20. One of the source and the drain of the transistor 53 in the first memory cell 20 is electrically connected to a wiring 59 that supplies a fixed potential. The other of the source and the drain of the transistor 53 in the n-th memory cell 20 is electrically connected to a reading bit line 57.

In the memory cell 20 in FIG. 9C, data is stored in a node 52 where the other of the source and the drain of the transistor 51, the gate of the transistor 53, and the one electrode of the capacitor 54 are electrically connected to each other. As the fixed potential, a ground potential (GND), 0 V, or the like can be employed. Further, the transistor 51 is a transistor whose channel region is formed with an oxide semiconductor (OS). On the other hand, there is no particular limitation on the semiconductor material for a channel region of the transistor 53.

In the memory cell 20 in FIG. 9C, switching of the transistor 53 can be controlled in accordance with the potential of the node 52. In addition, the potential of the node 52 can be controlled by capacitive coupling with the reading word line 56. Note that in a semiconductor storage device including the memory cell 20 illustrated in FIG. 9C, in order to read data stored in any one of n memory cells 20 arranged in one column, the potentials of the reading word lines 56 connected to (n−1) memory cells 20 other than the memory cell 20 subjected to data reading are raised to high level. Thus, the transistors 53 included in the (n−1) memory cells 20 other than the memory cell 20 subjected to data reading are turned on. Consequently, electrical connection is established between one of the source and the drain of the transistor 53 in the memory cell 20 subjected to data reading and the wiring that supplies a fixed potential, and between the other of the source and the drain thereof and the reading bit line 57. Here, stored data can be obtained by judging the state (the on state or the off state) of the transistor 53 in the memory cell 20 subjected to data reading. Specifically, stored data can be obtained in such a manner that, for example, a voltage divider circuit is constituted by the transistor 53 included in the memory cell 20 subjected to data reading and an output signal of the voltage divider circuit is judged. Note that in order to judge multilevel data in the memory cell 20 in FIG. 9C, the state (the on state or the off state) of the transistor 53 needs to be judged under a plurality of conditions with different potentials of the reading word line 56. Further, the memory cell 20 in FIG. 9C can also be used as a memory cell that stores binary data.

<First Specific Example of Control Circuit 13>

Figure 10A:
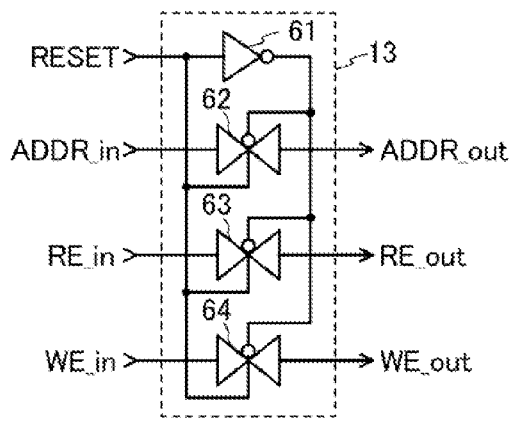
FIGS. 10A to 10C are circuit diagrams each illustrating a specific example of a control circuit.
Figure 10B:
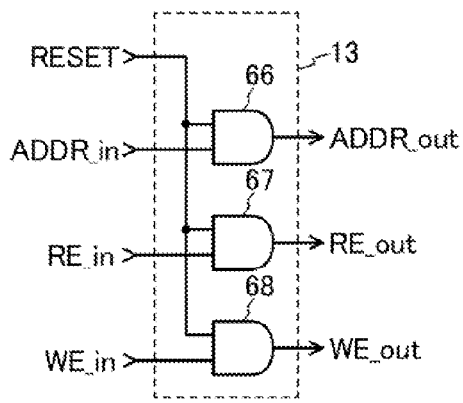
Figure 10C:
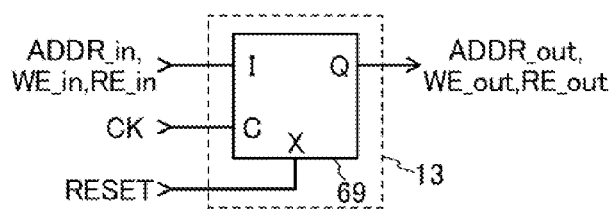

FIGS. 10A to 10C are circuit diagrams each illustrating a specific example of the control circuit 13. Simply put, each of the control circuits 13 illustrated in FIGS. 10A to 10C is a circuit that selects whether to output control signals input from the outside (in FIGS. 10A to 10C, an address signal (ADDR_in), a read control signal (RE_in), and a write control signal (WE_in) correspond to such control signals) to the row decoder and the column decoder in accordance with a reset signal (RESET).

For example, it is possible that the control circuit 13 does not output a control signal to the row decoder and the column decoder in a given period when power supply starts and outputs a control signal after the given period passes. In that case, it is preferable that the control circuit 13 do not output a control signal to the row decoder and the column decoder in a period during which the reset signal (RESET) has a ground potential (GND). This is because if the control circuit 13 does not output a control signal to the row decoder and the column decoder in a period during which the reset signal (RESET) has a potential other than the ground potential (GND), malfunction might occur since a control signal is supplied to the row decoder and the column decoder after the power supply starts and until the potential of a wiring that supplies the reset signal (RESET) to the control circuit 13 becomes a potential other than the ground potential (GND).

Note that each of the control circuits 13 illustrated in FIGS. 10A to 10C is a digital circuit whose operation is controlled with a low-level potential that is the ground potential (GND) and a high-level potential that is higher than the ground potential (GND).

The control circuit 13 in FIG. 10A includes an inverter 61, a switch 62, a switch 63, and a switch 64. An input terminal of the inverter 61 is electrically connected to a wiring that supplies the reset signal (RESET). An input terminal of the switch 62 is electrically connected to a wiring that supplies the address signal (ADDR_in). An input terminal of the switch 63 is electrically connected to a wiring that supplies the read control signal (RE_in). An input terminal of the switch 64 is electrically connected to a wiring that supplies the write control signal (WE_in). Note that the switches 62 to 64 are designed so that they are turned on when the potential of the reset signal (RESET) is set at high level and are turned off when the potential of the reset signal (RESET) is set at low level. Therefore, the control circuit 13 in FIG. 10A outputs control signals to the row decoder and the column decoder when the reset signal (RESET) has a high-level potential, and makes the potentials of the wirings that supply the control signals to the row decoder and the column decoder floating when the reset signal (RESET) has a low-level potential. Note that the control circuit 13 illustrated in FIG. 10A is preferable to the control circuits 13 illustrated in FIGS. 10B and 10C in that the number of transistors necessary for constituting the circuit is smaller.

The control circuit 13 in FIG. 10B includes an AND gate 66, an AND gate 67, and an AND gate 68. A first input terminal of the AND gate 66 is electrically connected to a wiring that supplies the reset signal (RESET). A second input terminal of the AND gate 66 is electrically connected to a wiring that supplies the address signal (ADDR_in). A first input terminal of the AND gate 67 is electrically connected to the wiring that supplies the reset signal (RESET). A second input terminal of the AND gate 67 is electrically connected to a wiring that supplies the read control signal (RE_in). A first input terminal of the AND gate 68 is electrically connected to the wiring that supplies the reset signal (RESET). A second input terminal of the AND gate 68 is electrically connected to a wiring that supplies the write control signal (WE_in). Therefore, the control circuit 13 in FIG. 10B outputs control signals to the row decoder and the column decoder when the potential of the reset signal (RESET) is set at high level, and sets the potentials of the wirings that supply the control signals to the row decoder and the column decoder at low level when the potential of the reset signal (RESET) is set at low level. Note that the control circuit 13 in FIG. 10B is preferable in that the potentials of the wirings that supply the control signals to the row decoder and the column decoder are not made floating, which means that the probability of malfunction occurring in the row decoder and the column decoder can be further reduced.

The control circuit 13 in FIG. 10C includes a flip-flop 69 to which control signals (the address signal (ADDR_in), the write control signal (WE_in), and the read control signal (RE_in) in FIG. 10C), a clock signal (CK), and the reset signal (RESET) are input. The flip-flop 69 in FIG. 10C outputs the control signals in accordance with the cycle of the clock signal when the potential of the reset signal (RESET) is set at high level, and sets the potentials of the wirings that supply the control signals to the row decoder and the column decoder at low level when the potential of the reset signal (RESET) is set at low level. Note that the control circuit 13 in FIG. 10C is preferable in that the potentials of the wirings that supply the control signals to the row decoder and the column decoder are not made floating, which means that the probability of malfunction occurring in the row decoder and the column decoder can be further reduced.

Figure 10D:
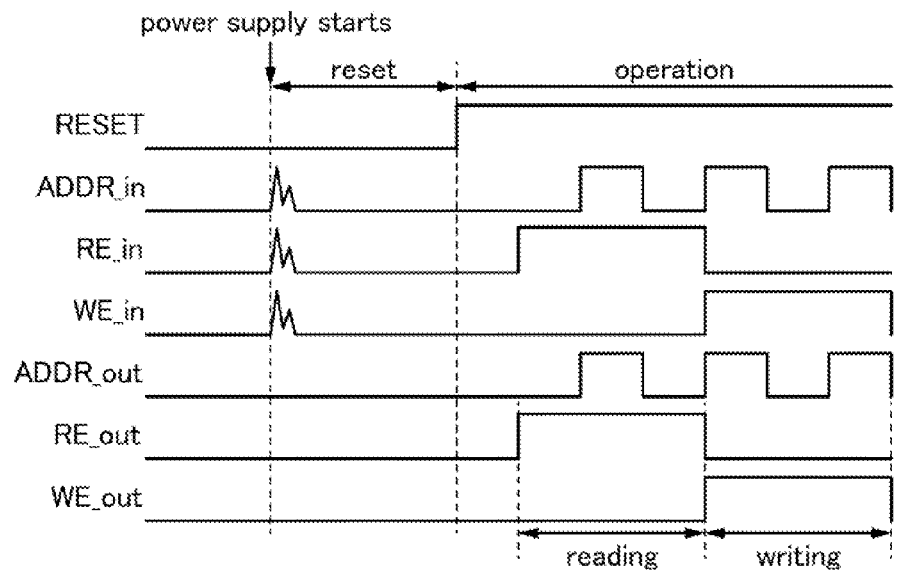
FIG. 10D is a timing chart illustrating an operation example of a control circuit.

FIG. 10D is a timing chart illustrating a specific example of the operation of the control circuits 13 illustrated in FIGS. 10A to 10C. In the operation example shown in FIG. 10D, a reset period during which the reset signal (RESET) has a low-level potential is provided over a given period after power supply starts. Accordingly, even if the potentials of the wirings that supply the control signals (the address signal (ADDR_in), the read control signal (RE_in), and the write control signal (WE_in)) to the control circuit 13 are varied by noise generated when power supply starts, the potentials of these wirings are not input to the row decoder and the column decoder. In other words, malfunction of the row decoder and the column decoder can be suppressed.

<Second Specific Example of Control Circuit 13>

Figure 11A:
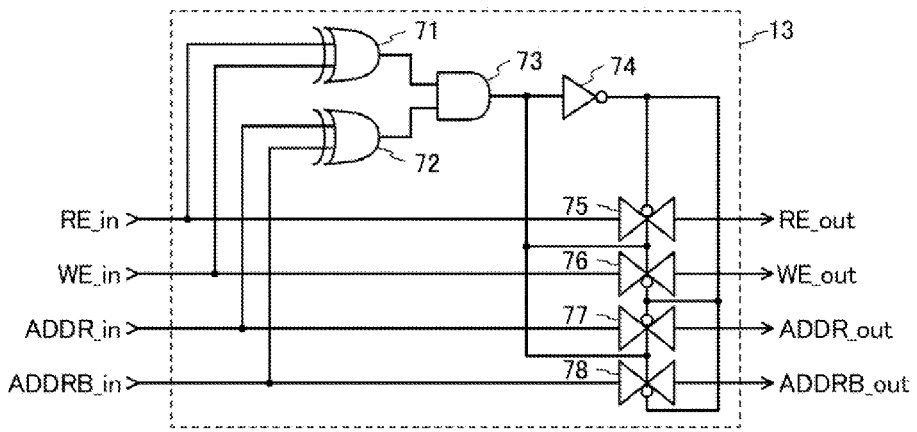
FIGS. 11A and 11B are circuit diagrams each illustrating a specific example of a control circuit.
Figure 11B:
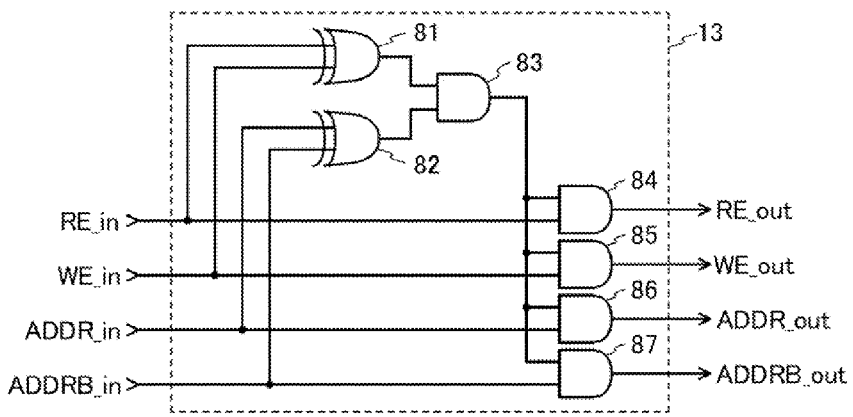

FIGS. 11A and 11B are circuit diagrams each illustrating a specific example of the control circuit 13. Simply put, the control circuits 13 illustrated in FIGS. 11A and 11B operate as follows. When the potential of a wiring supplied with a control signal (the address signal (ADDR_in) in FIGS. 11A and 11B) and the potential of a wiring supplied with an inverted control signal (an inverted address signal (ADDRB_in) in FIGS. 11A and 11B), which is an inversion signal of the control signal, are inverse to each other, the control circuit 13 outputs the control signal and the inverted control signal to the row decoder and the column decoder. When these signals are not inverse to each other, the control circuit 13 does not output the control signal and the inverted control signal to the row decoder and the column decoder. In a semiconductor storage device including the control circuit 13 illustrated in FIG. 11A or FIG. 11B, the row decoder and the column decoder select a given memory cell in accordance with the control signal and the inverted control signal.

Note that in the case where the row decoder and the column decoder operate only with the control signal, the control circuit 13 can be a circuit that selects whether to output only the control signal to row decoder and the column decoder depending on the states of the potential of the wiring supplied with the control signal and the potential of the wiring supplied with the inverted control signal (i.e., depending on whether these control signals are inverse to each other).

The control circuit 13 illustrated in FIG. 11A includes an XOR gate 71, an XOR gate 72, an AND gate 73, an inverter 74, a switch 75, a switch 76, a switch 77, and a switch 78. A first input terminal of the XOR gate 71 is electrically connected to a wiring that supplies the read control signal (RE_in). A second input terminal of the XOR gate 71 is electrically connected to a wiring that supplies the write control signal (WE_in). A first input terminal of the XOR gate 72 is electrically connected to a wiring that supplies the address signal (ADDR_in). A second input terminal of the XOR gate 72 is electrically connected to a wiring that supplies the inverted address signal (ADDRB_in). A first input terminal of the AND gate 73 is electrically connected to an output terminal of the XOR gate 71. A second input terminal of the AND gate 73 is electrically connected to an output terminal of the XOR gate 72. An input terminal of the inverter 74 is electrically connected to an output terminal of the AND gate 73. An input terminal of the switch 75 is electrically connected to the wiring that supplies the read control signal (RE_in). An input terminal of the switch 76 is electrically connected to the wiring that supplies the write control signal (WE_in). An input terminal of the switch 77 is electrically connected to the wiring that supplies the address signal (ADDR_in). An input terminal of the switch 78 is electrically connected to the wiring that supplies the inverted address signal (ADDRB_in).

Note that the switches 75 to 78 are designed so that they are turned on when the potential of the output signal of the AND gate 73 is set at high level (when the potential of the output signal of the inverter 74 is set at low level) and are turned off when the potential of the output signal of the AND gate 73 is set at low level (when the potential of the output signal of the inverter 74 is set at high level). Therefore, the control circuit 13 in FIG. 11A outputs the read control signal (RE_in), the write control signal (WE_in), the address signal (ADDR_in), and the inverted address signal (ADDRB_in) to the row decoder and the column decoder in the case where only one of the potential of the wiring supplying the read control signal (RE_in) and the potential of the wiring supplying the write control signal (WE_in) is a high-level potential and the potential of the wiring supplying the address signal (ADDR_in) is the inverse of the potential of the wiring supplying the inverted address signal (ADDRB_in), and makes the potentials of the wirings that supply these signals to the row decoder and the column decoder floating when the above conditions are not satisfied.

In the control circuit 13 in FIG. 11A, the probability of malfunction occurring in the row decoder and the column decoder can be reduced even if the potential of the wiring that supplies one of the read control signal (RE_in), the write control signal (WE_in), the address signal (ADDR_in), and the inverted address signal (ADDRB_in) is varied by noise or the like. Further, the control circuit 13 in FIG. 11A is preferable to the control circuit 13 in FIG. 11B in that the number of transistors necessary for constituting the circuit is smaller.

The control circuit 13 illustrated in FIG. 11B includes an XOR gate 81, an XOR gate 82, an AND gate 83, an AND gate 84, an AND gate 85, an AND gate 86, and an AND gate 87. A first input terminal of the XOR gate 81 is electrically connected to a wiring that supplies the read control signal (RE_in). A second input terminal of the XOR gate 81 is electrically connected to a wiring that supplies the write control signal (WE_in). A first input terminal of the XOR gate 82 is electrically connected to a wiring that supplies the address signal (ADDR_in). A second input terminal of the XOR gate 82 is electrically connected to a wiring that supplies the inverted address signal (ADDRB_in). A first input terminal of the AND gate 83 is electrically connected to an output terminal of the XOR gate 81. A second input terminal of the AND gate 83 is electrically connected to an output terminal of the XOR gate 82. A first input terminal of the AND gate 84 is electrically connected to an output terminal of the AND gate 83. A second input terminal of the AND gate 84 is electrically connected to the wiring that supplies the read control signal (RE_in). A first input terminal of the AND gate 85 is electrically connected to the output terminal of the AND gate 83. A second input terminal of the AND gate 85 is electrically connected to the wiring that supplies the write control signal (WE_in). A first input terminal of the AND gate 86 is electrically connected to the output terminal of the AND gate 83. A second input terminal of the AND gate 86 is electrically connected to the wiring that supplies the address signal (ADDR_in). A first input terminal of the AND gate 87 is electrically connected to the output terminal of the AND gate 83. A second input terminal of the AND gate 87 is electrically connected to the wiring that supplies the inverted address signal (ADDRB_in).

Therefore, the control circuit 13 in FIG. 11B outputs the read control signal (RE_in), the write control signal (WE_in), the address signal (ADDR_in), and the inverted address signal (ADDRB_in) to the row decoder and the column decoder in the case where only one of the potential of the wiring supplying the read control signal (RE_in) and the potential of the wiring supplying the write control signal (WE_in) is a high-level potential and the potential of the wiring supplying the address signal (ADDR_in) is the inverse of the potential of the wiring supplying the inverted address signal (ADDRB_in), and sets the potentials of the wirings that supply these signals to the row decoder and the column decoder at low level when the above conditions are not satisfied. Note that the control circuit 13 in FIG. 11B is preferable in that the potentials of the wirings that supply the control signals to the row decoder and the column decoder are not made floating. Thus, the probability of malfunction occurring in the row decoder and the column decoder can be further reduced.

<Specific Example of Transistor Included in Semiconductor Storage Device>

An example of transistors included in the semiconductor storage device will be described below. Specifically, an example of the case where a transistor formed using a substrate containing a semiconductor material and a transistor formed using an oxide semiconductor will be described.

A transistor 160 illustrated in FIG. 12 includes a channel region 116 provided in a substrate 100 containing a semiconductor material, a pair of impurity regions 114a and 114b and a pair of high concentration impurity regions 120a and 120b (these regions are also collectively referred to simply as impurity regions) provided so that the channel region 116 is placed therebetween, a gate insulating film 108a provided over the channel region 116, a gate layer 110a provided over the gate insulating film 108a, a source layer 130a electrically connected to the impurity region 114a, and a drain layer 130b electrically connected to the impurity region 114b.

Note that sidewall insulating layers 118 are provided on side surfaces of the gate layer 110a. In the substrate 100 containing a semiconductor material, the pair of high concentration impurity regions 120a and 120b is placed in regions that do not overlap with the sidewall insulating layers 118. A pair of metal compound regions 124a and 124b is placed on the pair of high concentration impurity regions 120a and 120b. An element isolation insulating layer 106 is provided over the substrate 100 so as to surround the transistor 160. An interlayer insulating layer 126 and an interlayer insulating layer 128 are provided so as to cover the transistor 160. The source layer 130a is electrically connected to the metal compound region 124a through an opening formed in the interlayer insulating layers 126 and 128. The drain layer 130b is electrically connected to the metal compound region 124b through an opening formed in the interlayer insulating layers 126 and 128. That is, the source layer 130a is electrically connected to the high concentration impurity region 120a and the impurity region 114a through the metal compound region 124a, and the drain layer 130b is electrically connected to the high concentration impurity region 120b and the impurity region 114b through the metal compound region 124b.

In addition, an insulating layer 108b using the same material as the gate insulating film 108a, an electrode layer 110b using the same material as the gate layer 110a, and an electrode layer 130c using the same material as the source layer 130a and the drain layer 130b are provided below a transistor 164 described later.

The transistor 164 illustrated in FIG. 12 includes a gate layer 136d provided over the interlayer insulating layer 128, a gate insulating film 138 provided over the gate layer 136d, an oxide semiconductor layer 140 provided over the gate insulating film 138, and a source layer 142a and a drain layer 142b that are provided over the oxide semiconductor layer 140 and electrically connected to the oxide semiconductor layer 140.

Here, the gate layer 136d is provided to be embedded in an insulating layer 132 formed over the interlayer insulating layer 128. Like the gate layer 136d, an electrode layer 136a and an electrode layer 136b that are included in the transistor 160 and are in contact with the source layer 130a and the drain layer 130b, respectively, are formed. In addition, an electrode layer 136c in contact with the electrode layer 130c is formed.

A protective insulating layer 144 is provided over the transistor 164 so as to be in contact with part of the oxide semiconductor layer 140. An interlayer insulating layer 146 is provided over the protective insulating layer 144. Here, openings reaching the source layer 142a and the drain layer 142b are provided in the protective insulating layer 144 and the interlayer insulating layer 146. An electrode layer 150d in contact with the source layer 142a and an electrode layer 150e in contact with the drain layer 142b are formed through the openings. Like the electrode layers 150d and 150e, an electrode layer 150a in contact with the electrode layer 136a, an electrode layer 150b in contact with the electrode layer 136b, and an electrode layer 150c in contact with the electrode layer 136c are formed through openings provided in the gate insulating film 138, the protective insulating layer 144, and the interlayer insulating layer 146.

The oxide semiconductor layer 140 is highly purified by sufficient removal of impurities such as hydrogen. Specifically, the hydrogen concentration of the oxide semiconductor layer 140 is $5\times10^{19}$ (atoms/cm$^3$) or lower. Note that the hydrogen concentration of the oxide semiconductor layer 140 is preferably $5\times10^{18}$ (atoms/cm$^3$) or lower, further preferably $5\times10^{17}$ (atoms/cm$^3$) or lower. The transistor 164 with excellent off-state current characteristics can be obtained with the use of such an oxide semiconductor layer 140 that is highly purified by a sufficient reduction in hydrogen concentration. For example, when the drain voltage Vd is +1 V or +10 V, the leakage current is $1\times10^{-13}$ [A] or less. By using the oxide semiconductor layer 140 which is highly purified by sufficiently reducing the hydrogen concentration, the leakage current of the transistor 164 can be reduced. Note that the hydrogen concentration of the oxide semiconductor layer 140 is measured by secondary ion mass spectrometry (SIMS).

Further, an insulating layer 152 is provided over the interlayer insulating layer 146, and an electrode layer 154a, an electrode layer 154b, an electrode layer 154c, and an electrode layer 154d are provided so as to be embedded in the insulating layer 152. Note that the electrode layer 154a is in contact with the electrode layer 150a; the electrode layer 154b is in contact with the electrode layer 150b; the electrode layer 154c is in contact with the electrode layer 150c and the electrode layer 150d; and the electrode layer 154d is in contact with the electrode layer 150e.

The source layer 130a included in the transistor 160 in FIG. 12 is electrically connected to the electrode layers 136a, 150a, and 154a which are provided in the upper region. Thus, by forming these electrode layers as appropriate, the source layer 130a in the transistor 160 can be electrically connected to any of the electrode layers included in the transistor 164 provided in the upper region. Similarly, the drain layer 130b in the transistor 160 can also be electrically connected to any of the electrode layers included in the transistor 164 provided in the upper region. Although not illustrated in FIG. 12, the gate layer 110a in the transistor 160 can be electrically connected to any of the electrode layers included in the transistor 164 through an electrode layer provided in the upper region.

Similarly, the source layer 142a included in the transistor 164 in FIG. 12 is electrically connected to the electrode layers 130c and 110b provided in the lower region. Thus, by forming these electrode layers as appropriate, the source layer 142a in the transistor 164 can be electrically connected to any of the gate layer 110a, the source layer 130a, and the drain layer 130b which are included in the transistor 160 provided in the lower region. Although not illustrated in FIG. 12, the gate layer 136d or the drain layer 142b in the transistor 164 can be electrically connected to any of the electrode layers included in the transistor 160 through an electrode layer provided in the lower region.

<Example of Process for Forming Transistors>

Next, examples of methods for fabricating the transistor 160 and the transistor 164 will be described. A method for fabricating the transistor 160 is described first with reference to FIGS. 13A to 13H, and then, a method for fabricating the transistor 164 is described with reference to FIGS. 14A to 14G and FIGS. 15A to 15D.

Figure 13A:
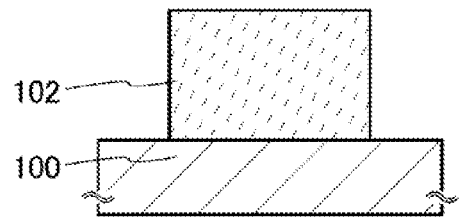
FIGS. 13A to 13H illustrate a specific example of steps for fabricating a transistor.

First, the substrate 100 containing a semiconductor material is prepared (see FIG. 13A). As the substrate 100 containing a semiconductor material, a single crystal semiconductor substrate or a polycrystalline semiconductor substrate of silicon, silicon carbide, or the like, a compound semiconductor substrate of silicon germanium or the like, an SOI substrate, or the like can be used. Here, an example where a single crystal silicon substrate is used as the substrate 100 containing a semiconductor material is described. Note that in general, the "SOI substrate" means a substrate in which a silicon semiconductor layer is provided on an insulating surface. In this specification and the like, the "SOI substrate" also includes a substrate in which a semiconductor layer containing a material other than silicon is provided over an insulating surface in its category. That is, a semiconductor layer included in the "SOI substrate" is not limited to a silicon semiconductor layer. Further, the "SOI substrate" includes a substrate in which a semiconductor layer is formed over an insulating substrate such as a glass substrate with an insulating layer placed therebetween.

A protective layer 102 serving as a mask for formation of an element isolation insulating layer is formed over the substrate 100 (see FIG. 13A). As the protective layer 102, an insulating layer formed using silicon oxide, silicon nitride, silicon nitride oxide, or the like can be used, for example. Note that before or after this step, an impurity element imparting n-type conductivity or an impurity element imparting p-type conductivity may be added to the substrate 100 in order to control the threshold voltage of a transistor. When silicon is used as the semiconductor, phosphorus, arsenic, or the like can be used as the impurity imparting n-type conductivity. Boron, aluminum, gallium, or the like can be used as the impurity imparting p-type conductivity.

Next, part of the substrate 100 which is not covered with the protective layer 102 (i.e., the substrate 100 in an exposed region) is removed by etching with the use of the protective layer 102 as a mask. Thus, an isolated semiconductor region 104 is formed (see FIG. 13B). As the etching, dry etching is preferably performed, but wet etching may be performed. An etching gas or an etchant can be selected as appropriate depending on materials of layers to be etched.

Figure 13B:
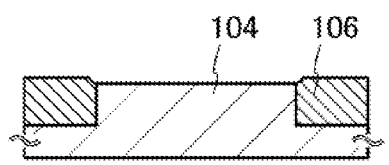

Then, an insulating layer is formed to cover the semiconductor region 104, and part of the insulating layer which overlaps with the semiconductor region 104 is selectively removed, so that the element isolation insulating layers 106 are formed (see FIG. 13B). The insulating layer is formed using silicon oxide, silicon nitride, silicon nitride oxide, or the like. As a method for removing the insulating layer, any of polishing treatment such as chemical mechanical polishing (CMP), etching treatment, and the like can be employed. Note that the protective layer 102 is removed after the formation of the semiconductor region 104 or after the formation of the element isolation insulating layers 106.

Next, an insulating layer is formed over the semiconductor region 104, and a layer containing a conductive material is formed over the insulating layer.

The insulating layer serves as a gate insulating film later, and preferably has a single-layer structure or a stacked structure using a film containing silicon oxide, silicon nitride oxide, silicon nitride, hafnium oxide, aluminum oxide, tantalum oxide, or the like formed by CVD, sputtering, or the like. Alternatively, the insulating layer may be formed in such a manner that a surface of the semiconductor region 104 is oxidized or nitrided by high-density plasma treatment or thermal oxidation treatment. The high-density plasma treatment can be performed using, for example, a mixed gas of a rare gas such as He, Ar, Kr, or Xe and a gas such as oxygen, nitrogen oxide, ammonia, or nitrogen. There is no particular limitation on the thickness of the insulating layer; the insulating layer can have a thickness of 1 nm to 100 nm, for example.

The layer containing a conductive material can be formed using a metal material such as aluminum, copper, titanium, tantalum, or tungsten. The layer containing a conductive material may be formed using a semiconductor material such as polycrystalline silicon containing a conductive material.

There is no particular limitation on the method for forming the layer containing a conductive material, and a variety of film formation methods such as evaporation, CVD, sputtering, and spin coating can be employed. Note that here, an example of the case where the layer containing a conductive material is formed using a metal material is described.

Figure 13C:
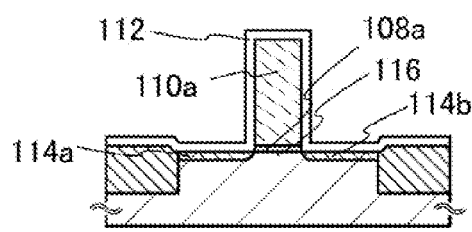

After that, the insulating layer and the layer containing a conductive material are selectively etched, so that the gate insulating film 108a and the gate layer 110a are formed (see FIG. 13C).

Next, an insulating layer 112 that covers the gate layer 110a is formed (see FIG. 13C). Then, boron (B), phosphorus (P), arsenic (As), or the like is added to the semiconductor region 104, so that the pair of impurity regions 114a and 114b with a shallow junction is formed (see FIG. 13C). Note that by formation of the pair of impurity regions 114a and 114b, the channel region 116 is formed in the semiconductor region 104 below the gate insulating film 108a (see FIG. 13C). Here, the concentration of the impurity added can be set as appropriate; the concentration is preferably increased when the size of the semiconductor element is extremely decreased. Although the pair of impurity regions 114a and 114b is formed after formation of the insulating layer 112 here, the insulating layer 112 may be formed after formation of the pair of impurity regions 114a and 114b.

Figure 13D:
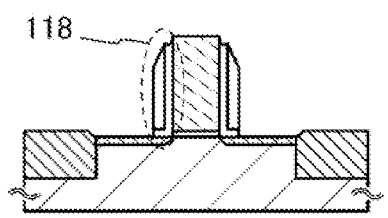
Figure 13E:
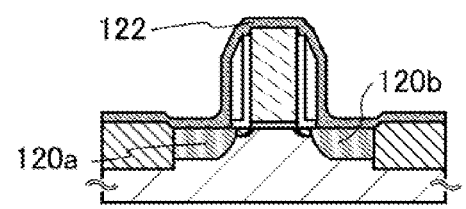
Figure 13F:
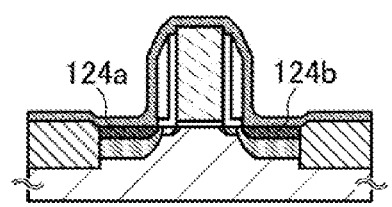

Next, the sidewall insulating layers 118 are formed (see FIG. 13D). The sidewall insulating layers 118 can be formed in a self-aligned manner by forming an insulating layer so as to cover the insulating layer 112 and then performing highly anisotropic etching on the insulating layer. At this time, by partial etching of the insulating layer 112, an upper surface of the gate layer 110a and upper surfaces of the pair of impurity regions 114a and 114b are preferably exposed.

Next, an insulating layer is formed so as to cover the gate layer 110a, the pair of impurity regions 114a and 114b, the sidewall insulating layers 118, and the like. Then, boron (B), phosphorus (P), arsenic (As), or the like is added to part of the impurity regions 114a and 114b, whereby the pair of high concentration impurity regions 120a and 120b is formed (see FIG. 13E). After that, the insulating layer is removed, and a metal layer 122 is formed so as to cover the gate layer 110a, the sidewall insulating layers 118, the pair of high concentration impurity regions 120a and 120b, and the like (see FIG. 13E). The metal layer 122 can be formed by a variety of film formation methods such as vacuum evaporation, sputtering, and spin coating. The metal layer 122 is preferably formed using a metal material that reacts with a semiconductor material included in the semiconductor region 104 to be a low-resistance metal compound. Examples of such metal materials are titanium, tantalum, tungsten, nickel, cobalt, and platinum.

Next, heat treatment is performed so that the metal layer 122 reacts with the semiconductor material. Thus, the pair of metal compound regions 124a and 124b in contact with the pair of high concentration impurity regions 120a and 120b is formed (see FIG. 13F). Note that when the gate layer 110a is formed using polycrystalline silicon or the like, a metal compound region is also formed in a region of the gate layer 110a in contact with the metal layer 122.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction for formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 122 is removed after the pair of metal compound regions 124a and 124b is formed.

Figure 13G:
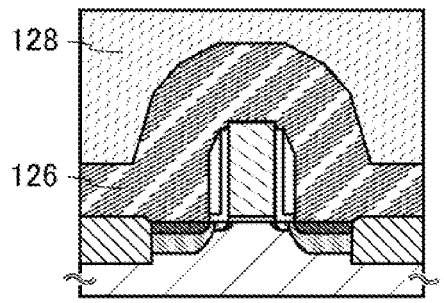

Next, the interlayer insulating layer 126 and the interlayer insulating layer 128 are formed so as to cover the components formed in the above steps (see FIG. 13G). The interlayer insulating layers 126 and 128 can be formed using an inorganic insulating material such as silicon oxide, silicon nitride oxide, silicon nitride, hafnium oxide, aluminum oxide, or tantalum oxide. Moreover, the interlayer insulating layers 126 and 128 can be formed using an organic insulating material such as polyimide or acrylic. Note that the interlayer insulating layer has a two-layer structure of the interlayer insulating layer 126 and the interlayer insulating layer 128 here; it is not limited to having this structure. After the formation of the interlayer insulating layer 128, a surface of the interlayer insulating layer 128 is preferably planarized with CMP, etching, or the like.

Figure 13H:
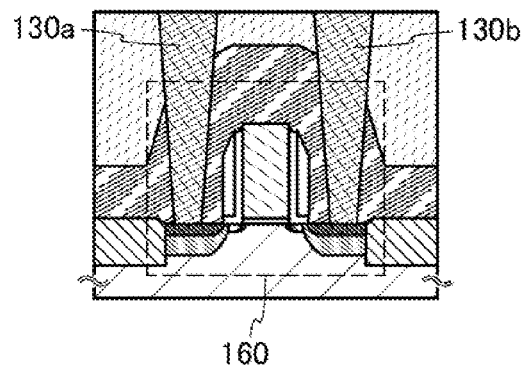

After that, openings reaching the pair of metal compound regions 124a and 124b are formed in the interlayer insulating layers, and the source layer 130a and the drain layer 130b are formed in the openings (see FIG. 13H). The source layer 130a and the drain layer 130b can be formed in such a manner, for example, that a conductive layer is formed in a region including the openings by PVD, CVD, or the like and then part of the conductive layer is removed by etching or CMP.

It is preferable that the source layer 130a and the drain layer 130b be formed to have a planar surface. For example, when a thin titanium film or a thin titanium nitride film is formed in a region including the openings and then a tungsten film is formed to be embedded in the openings, excess tungsten, titanium, titanium nitride, or the like is removed and the planarity of the surface can be improved by subsequent CMP. In such a manner, the surface including the source layer 130a and the drain layer 130b is planarized, whereby an electrode, a wiring, an insulating layer, a semiconductor layer, and the like can be favorably formed in later steps.

Note that here, only the source layer 130a and the drain layer 130b which are in contact with the pair of metal compound regions 124a and 124b are illustrated; the electrode layer serving as a wiring (e.g., the electrode layer 130c in FIG. 12) or the like can be formed together in this step. There is no particular limitation on a material used for the source layer 130a and the drain layer 130b, and a variety of conductive materials can be used. For example, a conductive material such as molybdenum, titanium, chromium, tantalum, tungsten, aluminum, copper, neodymium, or scandium can be used. Alternatively, an alloy containing at least one of these conductive materials can be used. For example, an alloy that contains copper as its main component and also contains magnesium and aluminum can be used.

Through the above process, the transistor 160 using the substrate 100 containing a semiconductor material is formed. Note that an electrode, a wiring, an insulating layer, or the like may be further formed after the above step. When the wiring has a multilayer wiring structure which is a stacked structure including an interlayer insulating layer and a conductive layer, a highly integrated circuit can be provided.

Next, steps for fabricating the transistor 164 over the interlayer insulating layer 128 will be described with reference to FIGS. 14A to 14G and FIGS. 15A to 15D. Note that FIGS. 14A to 14G and FIGS. 15A to 15D illustrate steps for forming various electrode layers, the transistor 164, and the like over the interlayer insulating layer 128; therefore, the transistor 160 and the like placed below the transistor 164 are omitted.

Figure 14A:
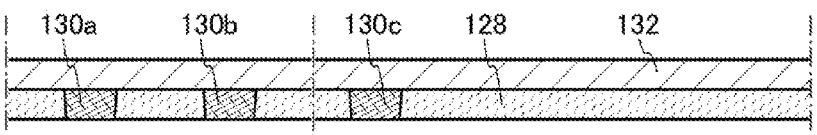
FIGS. 14A to 14G illustrate a specific example of steps for fabricating a transistor.

First, the insulating layer 132 is formed over the interlayer insulating layer 128, the source layer 130a, the drain layer 130b, and the electrode layer 130c (see FIG. 14A). The insulating layer 132 can be formed by PVD, CVD, or the like. The insulating layer 132 can be formed using an inorganic insulating material such as silicon oxide, silicon nitride oxide, silicon nitride, hafnium oxide, aluminum oxide, or tantalum oxide.

Figure 14B:
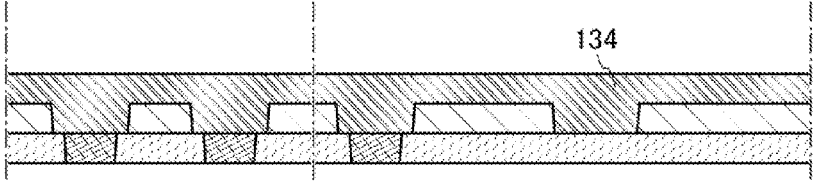

Next, openings that reach the source layer 130a, the drain layer 130b, and the electrode layer 130c are formed in the insulating layer 132. At this time, an opening is also formed in a region where the gate layer 136d is to be formed later. Then, a conductive layer 134 is formed so as to fill the openings (FIG. 14B). The openings can be formed by etching using a mask or the like. The mask can be formed by light exposure using a photomask or the like. Either wet etching or dry etching may be used as the etching; dry etching is preferably used in terms of microfabrication. The conductive layer 134 can be formed by a film formation method such as PVD or CVD. The conductive layer 134 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by PVD and a thin titanium nitride film is formed by CVD, and then, a tungsten film is formed to fill the openings. Here, the titanium film formed by PVD has a function of deoxidizing an oxide film at an interface so as to reduce contact resistance with the lower electrode layers (here, the source layer 130a, the drain layer 130b, the electrode layer 130c, and the like). The titanium nitride film formed after the formation of the titanium film has a barrier function of preventing diffusion of the conductive material. In addition, a copper film may be formed by plating after the formation of the barrier film of titanium, titanium nitride, or the like.

Figure 14C:
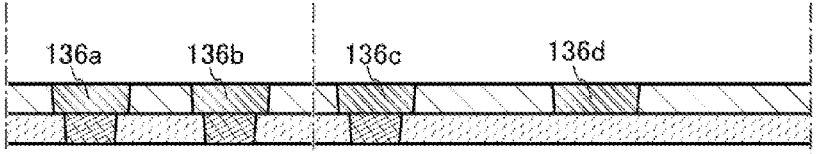

After the conductive layer 134 is formed, part of the conductive layer 134 is removed by etching, CMP, or the like, whereby the insulating layer 132 is exposed and the electrode layers 136a, 136b, and 136c and the gate layer 136d are formed (see FIG. 14C). Note that when the electrode layers 136a to 136c and the gate layer 136d are formed by removal of part of the conductive layer 134, the process is preferably performed so that the surfaces are planarized. The surfaces of the insulating layer 132, the electrode layers 136a to 136c, and the gate layer 136d are planarized in such a manner, whereby an electrode, a wiring, an insulating layer, a semiconductor layer, and the like can be favorably formed in later steps.

Figure 14D:
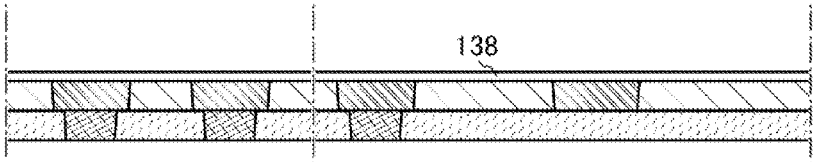

Next, the gate insulating film 138 is formed so as to cover the insulating layer 132, the electrode layers 136a to 136c, and the gate layer 136d (see FIG. 14D). The gate insulating film 138 can be formed by CVD, sputtering, or the like. It is preferable that the gate insulating film 138 contain silicon oxide, silicon nitride, silicon oxynitride, silicon nitride oxide, aluminum oxide, hafnium oxide, tantalum oxide, or the like. Note that the gate insulating film 138 may have a single-layer structure or a stacked structure. For example, the gate insulating film 138 made of silicon oxynitride can be formed by plasma-enhanced CVD using silane ($SiH_4$), oxygen, and nitrogen as a source gas. There is no particular limitation on the thickness of the gate insulating film 138; the gate insulating film 138 can have a thickness of 10 nm to 500 nm, for example. In the case of employing a stacked structure, for example, the gate insulating film 138 is preferably a stack of a first gate insulating film with a thickness of 50 nm to 200 nm, and a second gate insulating film with a thickness of 5 nm to 300 nm over the first gate insulating film.

Note that an oxide semiconductor which is made to be an i-type oxide semiconductor or a substantially i-type oxide semiconductor by removing an impurity (i.e., an oxide semiconductor which is highly purified) is extremely sensitive to an interface state or to the interface charge; thus, when such an oxide semiconductor is used for an oxide semiconductor layer, the interface between the oxide semiconductor layer and the gate insulating film is important. In other words, the gate insulating film 138 that is to be in contact with a highly purified oxide semiconductor layer needs to have high quality.

For example, high-density plasma-enhanced CVD using microwaves (2.45 GHz) is preferable because the gate insulating film 138 can be dense and have high withstand voltage and high quality. The highly purified oxide semiconductor layer and the high-quality gate insulating film are in close contact with each other, so that interface state density can be reduced and favorable interface characteristics can be obtained.

It is needless to say that, even when a highly purified oxide semiconductor layer is used, another method such as sputtering or plasma-enhanced CVD can be employed as long as a high-quality insulating layer can be formed as the gate insulating film. Moreover, it is possible to use an insulating layer whose quality and interface characteristics are improved with heat treatment performed after the formation of the insulating layer. In any case, an insulating layer that has favorable film quality as the gate insulating film 138 and can reduce interface state density of the interface with the oxide semiconductor layer to form a favorable interface is formed.

Figure 14E:
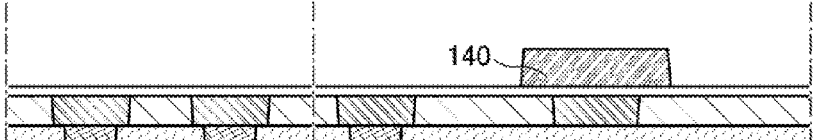

Then, an oxide semiconductor layer is formed over the gate insulating film 138 and processed by etching using a mask or the like, whereby the island-shaped oxide semiconductor layer 140 is formed (see FIG. 14E).

The oxide semiconductor layer contains at least one element selected from In, Ga, Sn, Zn, Al, Mg, Hf, and a lanthanoid. For example, it is preferable to use an oxide semiconductor layer, in particular, an amorphous oxide semiconductor layer of any of the following materials: an In—Sn—Ga—Zn-based oxide semiconductor, an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, a Sn—Al—Zn-based oxide semiconductor, an In—Hf—Zn-based oxide semiconductor, an In—La—Zn-based oxide semiconductor, an In—Ce—Zn-based oxide semiconductor, an In—Pr—Zn-based oxide semiconductor, an In—Nd—Zn-based oxide semiconductor, an In—Sm—Zn-based oxide semiconductor, an In—Eu—Zn-based oxide semiconductor, an In—Gd—Zn-based oxide semiconductor, an In—Tb—Zn-based oxide semiconductor, an In—Dy—Zn-based oxide semiconductor, an In—Ho—Zn-based oxide semiconductor, an In—Er—Zn-based oxide semiconductor, an In—Tm—Zn-based oxide semiconductor, an In—Yb—Zn-based oxide semiconductor, an In—Lu—Zn-based oxide semiconductor, a Zn—Mg-based oxide semiconductor, a Sn—Mg-based oxide semiconductor, an In—Mg-based oxide semiconductor, an In—Ga-based oxide semiconductor, an In—Zn-based oxide semiconductor, a Sn—Zn-based oxide semiconductor, an Al—Zn-based oxide semiconductor, an In-based oxide semiconductor, a Sn-based oxide semiconductor, and a Zn-based oxide semiconductor. Here, as the oxide semiconductor layer, an amorphous oxide semiconductor layer is formed by sputtering using an In—Ga—Zn-based metal oxide target. Since the addition of silicon to an amorphous oxide semiconductor layer suppresses the crystallization of the layer, the oxide semiconductor layer may be formed using a target containing $SiO_2$ at 2 wt % to 10 wt %, for example.

As a target used for forming the oxide semiconductor layer by sputtering, a metal oxide target containing zinc oxide or the like as its main component can be used, for example. Moreover, it is possible to use a metal oxide target containing In, Ga, and Zn (a composition ratio of $In_2O_3:Ga_2O_3:ZnO$=1:1:1 [molar ratio] and In:Ga:Zn=1:1:0.5 [atomic ratio]). As the oxide semiconductor target containing In, Ga, and Zn, it is possible to use a target having a composition ratio of In:Ga:Zn=1:1:1 [atomic ratio] or a composition ratio of In:Ga:Zn=1:1:2 [atomic ratio]. The filling factor of the metal oxide target is 90% to 100%, and preferably 95% or higher (e.g., 99.9%). With the use of a metal oxide target with high filling factor, a dense oxide semiconductor layer can be formed.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use a high-purity gas in which impurities such as hydrogen, water, a hydroxyl group, and a hydride are reduced to about several parts per million (ppm) (preferably about several parts per billion (ppb)).

At the time of forming the oxide semiconductor layer, the substrate is held in a treatment chamber that is maintained at reduced pressure, and the substrate temperature is set to 100° C. to 600° C., preferably 200° C. to 400° C. The oxide semiconductor layer is formed while the substrate is heated, so that the impurity concentration of the oxide semiconductor layer can be reduced. In addition, damage by sputtering can be reduced. Then, a sputtering gas from which hydrogen and water are removed is introduced into the treatment chamber from which remaining moisture is being removed, and the oxide semiconductor layer is formed using a metal oxide as a target. In order to remove remaining moisture in the treatment chamber, an entrapment vacuum pump is preferably used. For example, a cryopump, an ion pump, or a titanium sublimation pump can be used. The evacuation unit may be a turbo pump provided with a cold trap. A hydrogen atom, a compound containing a hydrogen atom, such as water ($H_2O$) (preferably, a compound containing a carbon atom as well), and the like are removed from the deposition chamber evacuated with a cryopump, so that the impurity concentration of the oxide semiconductor layer formed in the deposition chamber can be reduced.

The oxide semiconductor layer can be formed under the following conditions, for example: the distance between the substrate and the target is 100 mm; the pressure is 0.6 Pa; the direct-current (DC) power is 0.5 kW; and the atmosphere is oxygen (the flow rate ratio of oxygen is 100%). Note that the use of a pulse direct-current (DC) power source is preferably used because dust can be reduced and the film thickness can be uniform. The thickness of the oxide semiconductor layer is 2 nm to 200 nm, preferably 5 nm to 30 nm. Note that an appropriate thickness differs depending on an oxide semiconductor material, and the thickness is set as appropriate depending on the material to be used.

Note that before the oxide semiconductor layer is formed by sputtering, dust attached on the surface of the gate insulating film 138 is preferably removed by reverse sputtering in which plasma is generated with an argon gas introduced. Here, reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

As an etching method for the oxide semiconductor layer, either dry etching or wet etching can be employed. Needless to say, dry etching and wet etching can be used in combination. The etching conditions (e.g., an etching gas or an etchant, etching time, and temperature) are set as appropriate depending on the material so that the oxide semiconductor layer can be etched into a desired shape.

An example of an etching gas used for dry etching is a gas containing chlorine (a chlorine-based gas such as chlorine ($Cl_2$), boron trichloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching method, parallel plate RIE (reactive ion etching) or ICP (inductively coupled plasma) etching can be used. In order to etch the oxide semiconductor layer into a desired shape, etching conditions (e.g., the amount of power applied to a coiled electrode, the amount of power applied to an electrode on the substrate side, and the electrode temperature on the substrate side) are set as appropriate.

As an etchant used for wet etching, a mixed solution of phosphoric acid, acetic acid, and nitric acid can be used, for example. An etchant such as ITO-07N (produced by Kanto Chemical Co., Inc.) may also be used.

Then, the oxide semiconductor layer 140 is preferably subjected to first heat treatment. The oxide semiconductor layer can be dehydrated or dehydrogenated with the first heat treatment. The temperature of the first heat treatment is 300° C. or more and 750° C. or less, preferably 400° C. or more and less than the strain point of the substrate. For example, the substrate is introduced into an electric furnace using a resistance heating element or the like, and the oxide semiconductor layer 140 is subjected to heat treatment at 450° C. for one hour in a nitrogen atmosphere. The oxide semiconductor layer 140 is not exposed to the air during the heat treatment so that entry of water and hydrogen can be prevented.

The heat treatment apparatus is not limited to the electric furnace and can be an apparatus for heating an object by thermal radiation or thermal conduction from a medium such as a heated gas. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, for example, nitrogen or a rare gas such as argon is used.

For example, as the first heat treatment, a GRTA process may be performed as follows. The substrate is put in an inert gas that has been heated to a high temperature of 650° C. to 700° C., heated for several minutes, and taken out of the inert gas. The GRTA process enables high-temperature heat treatment for a short time. Moreover, the GRTA process can be employed even when the temperature exceeds the strain point of the substrate because it is heat treatment for a short time.

Note that the first heat treatment is preferably performed in an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or more, preferably 7N (99.99999%) or more (i.e., the impurity concentration is 1 ppm or less, preferably 0.1 ppm or less).

Depending on the conditions of the first heat treatment or the material of the oxide semiconductor layer, the oxide semiconductor layer is sometimes crystallized to be microcrystalline or polycrystalline. For example, the oxide semiconductor layer sometimes becomes a microcrystalline oxide semiconductor layer with a degree of crystallization of 90% or more, or 80% or more. Further, depending on the conditions of the first heat treatment or the material of the oxide semiconductor layer, the oxide semiconductor layer may be an amorphous oxide semiconductor layer including no crystalline component.

Furthermore, in the oxide semiconductor layer, a microcrystal (with a grain size of 1 nm to 20 nm, typically 2 nm to 4 nm) is sometimes mixed in an amorphous oxide semiconductor (e.g., a surface of the oxide semiconductor layer).

The electrical characteristics of the oxide semiconductor layer can be changed by aligning microcrystals in an amorphous semiconductor. For example, in the case where the oxide semiconductor layer is formed using an In—Ga—Zn—O-based metal oxide target, a microcrystalline portion where crystal grains of $In_2Ga_2ZnO_7$ having electrical anisotropy are aligned is formed, whereby the electric characteristics of the oxide semiconductor layer can be changed.

Specifically, for example, when the microcrystalline portion is arranged so that the c-axis of $In_2Ga_2ZnO_7$ is perpendicular to a surface of the oxide semiconductor layer, the conductivity in the direction parallel to the surface of the oxide semiconductor layer can be improved and the insulating properties in the direction perpendicular to the surface of the oxide semiconductor layer can be improved. Further, such a microcrystalline portion has a function of suppressing entry of impurities such as water or hydrogen into the oxide semiconductor layer.

Note that the oxide semiconductor layer including the microcrystalline portion can be formed by heating the surface of the oxide semiconductor layer by a GRTA process. In addition, the oxide semiconductor layer can be formed in a more preferred manner by using a sputtering target in which the amount of Zn is smaller than that of In or Ga.

The first heat treatment for the oxide semiconductor layer 140 can be performed on the oxide semiconductor layer that has not yet been processed into the island-shaped oxide semiconductor layer 140. In that case, after the first heat treatment, the substrate is taken out of the heating apparatus and a photolithography process is performed.

Note that the first heat treatment can be called dehydration treatment or dehydrogenation treatment because it is effective in dehydrating or dehydrogenating the oxide semiconductor layer 140. It is possible to perform such dehydration treatment or dehydrogenation treatment, for example, after the oxide semiconductor layer is formed, after source and drain layers are stacked over the oxide semiconductor layer 140, or after a protective insulating layer is formed over the source and drain layers. Such dehydration treatment or dehydrogenation treatment may be conducted once or plural times.

Figure 14F:
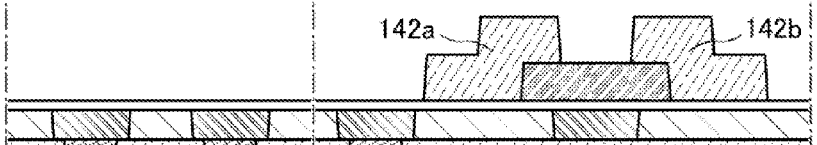

Next, the source layer 142a and the drain layer 142b are formed so as to be in contact with the oxide semiconductor layer 140 (see FIG. 14F). The source layer 142a and the drain layer 142b can be formed in such a manner that a conductive layer is formed so as to cover the oxide semiconductor layer 140 and then is selectively etched.

The conductive layer can be formed by PVD such as sputtering or CVD such as plasma-enhanced CVD. As a material for the conductive layer, an element selected from aluminum, chromium, copper, tantalum, titanium, molybdenum, and tungsten; an alloy containing any of these elements as a component; or the like can be used. Moreover, one or more materials selected from manganese, magnesium, zirconium, beryllium, and thorium may be used. Aluminum combined with one or more of elements selected from titanium, tantalum, tungsten, molybdenum, chromium, neodymium, and scandium may be used. The conductive layer can have a single-layer structure or a stacked structure including two or more layers. For example, the conductive layer can have a single-layer structure of an aluminum film containing silicon, a two-layer structure in which a titanium film is stacked over an aluminum film, or a three-layer structure in which a titanium film, an aluminum film, and a titanium film are stacked in this order.

Here, ultraviolet light, KrF laser light, or ArF laser light is preferably used for light exposure for forming an etching mask.

The channel length (L) of the transistor is determined by a distance between a lower edge portion of the source layer 142a and a lower edge portion of the drain layer 142b. Note that in the case where the channel length (L) is less than 25 nm, light exposure for forming a mask is performed with extreme ultraviolet rays whose wavelength is extremely short of several nanometers to several tens of nanometers. In the light exposure by extreme ultraviolet light, the resolution is high and the focus depth is large. For those reasons, the channel length (L) of the transistor to be formed later can be in the range of 10 nm to 1000 nm, and the circuit can operate at higher speed.

The materials and etching conditions of the conductive layer and the oxide semiconductor layer 140 are adjusted as appropriate so that the oxide semiconductor layer 140 is not removed in etching of the conductive layer. Note that in some cases, the oxide semiconductor layer 140 is partly etched in the etching step and thus has a groove portion (a recessed portion) depending on the materials and the etching conditions.

An oxide conductive layer may be formed between the oxide semiconductor layer 140 and the source layer 142a or between the oxide semiconductor layer 140 and the drain layer 142b. It is possible to successively form the oxide conductive layer and a metal layer that is to be the source layer 142a and the drain layer 142b (successive deposition). The oxide conductive layer can function as a source region or a drain region. The placement of such an oxide conductive layer can reduce the resistance of the source region or the drain region, so that the transistor can operate at higher speed.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed using a multi-tone mask has a plurality of thicknesses (has a stair-like shape) and further can be changed in shape by ashing; therefore, the resist mask can be used in a plurality of etching steps for providing different patterns. That is, a resist mask corresponding to at least two kinds of different patterns can be formed by using one multi-tone mask. Thus, the number of light-exposure masks can be reduced and the number of corresponding photolithography steps can also be reduced, whereby the process can be simplified.

Note that plasma treatment is preferably performed with the use of a gas such as $N_2O$, $N_2$, or Ar after the above step. This plasma treatment removes water or the like attached on an exposed surface of the oxide semiconductor layer. Alternatively, plasma treatment may be performed using a mixture gas of oxygen and argon.

Figure 14G:
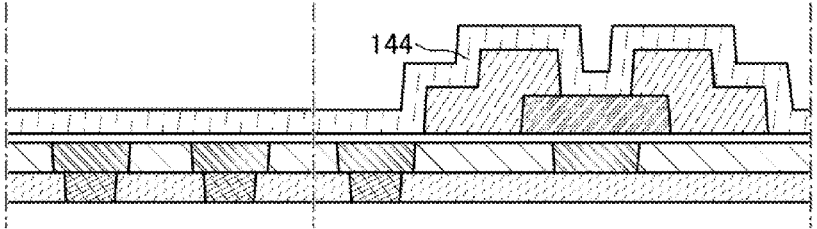

Next, the protective insulating layer 144 that is in contact with part of the oxide semiconductor layer 140 is formed without being exposed to the air (see FIG. 14G).

The protective insulating layer 144 can be formed by employing a method by which impurities such as water or hydrogen are prevented from entering the protective insulating layer 144, such as sputtering, as appropriate. The protective insulating layer 144 has a thickness of at least 1 nm. The protective insulating layer 144 can be formed using silicon oxide, silicon nitride, silicon oxynitride, silicon nitride oxide, or the like. The protective insulating layer 144 can have a single-layer structure or a stacked structure. The substrate temperature at the time of forming the protective insulating layer 144 is preferably room temperature or more and 300° C. or less. The atmosphere for forming the protective insulating layer 144 is preferably a rare gas (typically argon) atmosphere, an oxygen atmosphere, or a mixed atmosphere containing a rare gas (typically argon) and oxygen.

If hydrogen is contained in the protective insulating layer 144, hydrogen may enter the oxide semiconductor layer 140 or extract oxygen in the oxide semiconductor layer 140, whereby the resistance of the oxide semiconductor layer 140 on the backchannel side might be decreased and a parasitic channel might be formed. Therefore, it is important not to use hydrogen at the time of forming the protective insulating layer 144 so that the protective insulating layer 144 contains hydrogen as little as possible.

It is preferable to form the protective insulating layer 144 while removing moisture remaining in the treatment chamber, in order that hydrogen, a hydroxyl group, or moisture is not contained in the oxide semiconductor layer 140 and the protective insulating layer 144.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In the deposition chamber that is evacuated with a cryopump, a hydrogen atom, a compound containing a hydrogen atom, such as water ($H_2O$), and the like are removed; thus, the concentration of impurities contained in the protective insulating layer 144 formed in the deposition chamber can be reduced.

A sputtering gas used for the deposition of the protective insulating layer 144 is preferably a high-purity gas in which the concentration of impurities such as hydrogen, water, a hydroxyl group, or a hydride is reduced to about several parts per million (ppm) (preferably about several parts per billion (ppb)).

Next, second heat treatment is preferably performed in an inert gas atmosphere or an oxygen gas atmosphere (at 200° C. to 400° C., for example, at 250° C. to 350° C.). For example, the second heat treatment is performed at 250° C. for one hour in a nitrogen atmosphere. The second heat treatment can reduce variation in electric characteristics of the transistor.

Furthermore, heat treatment may be performed at 100° C. to 200° C. for 1 hour to 30 hours in the air. This heat treatment may be performed at a fixed heating temperature or follow temperature cycles in which the temperature repeatedly rises from room temperature to a heating temperature of 100° C. to 200° C. and drops from the heating temperature to room temperature. This heat treatment may be performed under reduced pressure before the protective insulating layer is formed. The heat treatment time can be shortened under reduced pressure. This heat treatment may be performed instead of the second heat treatment or may be performed before or after the second heat treatment, for example.

Figure 15A:
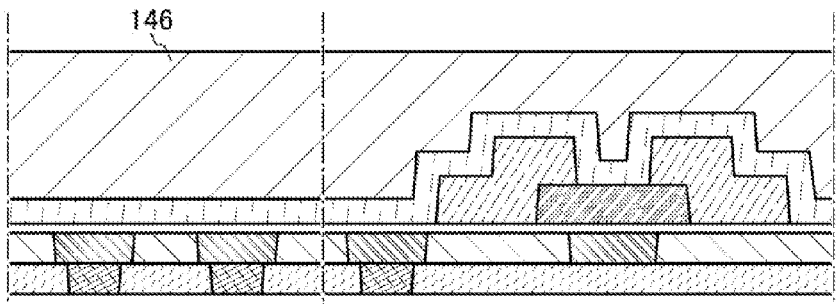
FIGS. 15A to 15D illustrate a specific example of steps for fabricating a transistor.
Figure 15B:
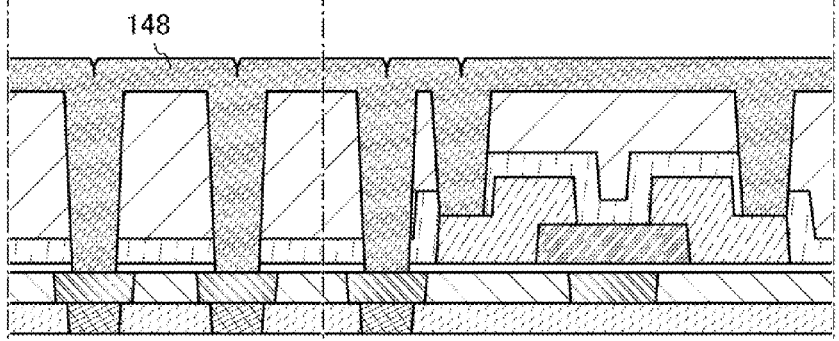

Then, the interlayer insulating layer 146 is formed over the protective insulating layer 144 (see FIG. 15A). The interlayer insulating layer 146 can be formed by PVD, CVD, or the like. The interlayer insulating layer 146 can be formed using an inorganic insulating material such as silicon oxide, silicon nitride oxide, silicon nitride, hafnium oxide, aluminum oxide, or tantalum oxide. After the formation of the interlayer insulating layer 146, a surface of the interlayer insulating layer 146 is preferably planarized with CMP, etching, or the like.

Next, openings that reach the electrode layers 136a to 136c, the source layer 142a, and the drain layer 142b are formed in the interlayer insulating layer 146, the protective insulating layer 144, and the gate insulating film 138. Then, a conductive layer 148 is formed to be embedded in the openings (see FIG. 15B). The openings can be formed by etching using a mask or the like. The mask can be formed by light exposure using a photomask or the like. Either wet etching or dry etching may be used as the etching; dry etching is preferably used in terms of microfabrication. The conductive layer 148 can be formed by a film formation method such as PVD or CVD. The conductive layer 148 can be formed using a conductive material such as molybdenum, titanium, chromium, tantalum, tungsten, aluminum, copper, neodymium, or scandium or an alloy or a compound (e.g., a nitride) of any of these materials, for example.

Specifically, it is possible to employ a method, for example, in which a thin titanium film is formed in a region including the openings by PVD and a thin titanium nitride film is formed by CVD, and then, a tungsten film is formed to be embedded in the openings. Here, the titanium film formed by PVD has a function of deoxidizing an oxide film at an interface so as to reduce contact resistance with the lower electrodes (here, the electrode layers 136a to 136c, the source layer 142a, and the drain layer 142b). The titanium nitride film formed after the formation of the titanium film has a barrier function of preventing diffusion of the conductive material. In addition, a copper film may be formed by plating after the formation of the barrier film of titanium, titanium nitride, or the like.

Figure 15C:
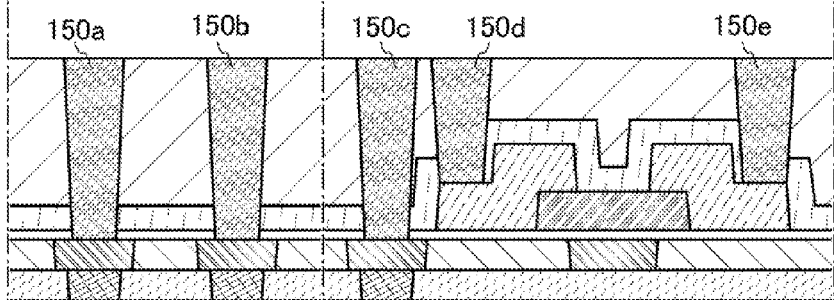
Figure 15D:
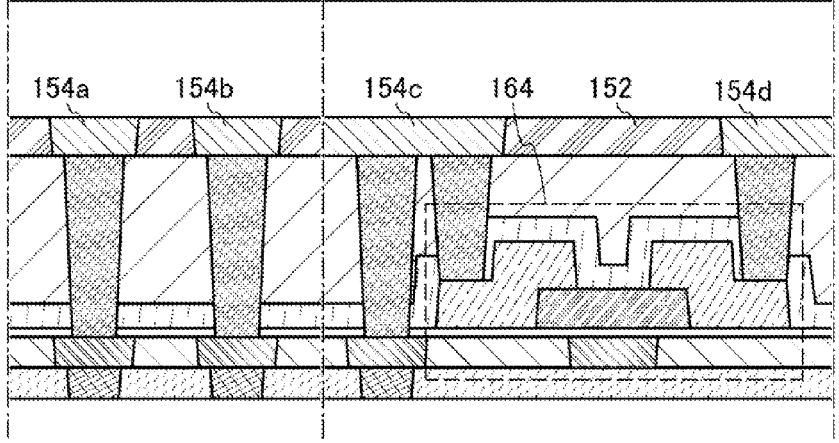

After the conductive layer 148 is formed, part of the conductive layer 148 is removed by etching, CMP, or the like, so that the interlayer insulating layer 146 is exposed and the electrode layers 150a, 150b, 150c, 150d, and 150e are formed (see FIG. 15C). Note that when the electrode layers 150a to 150e are formed by removal of part of the conductive layer 148, the process is preferably performed so that the surfaces are planarized. The surfaces of the interlayer insulating layer 146 and the electrode layers 150a to 150e are planarized in such a manner, whereby an electrode, a wiring, an insulating layer, a semiconductor layer, and the like can be favorably formed in later steps.

Then, the insulating layer 152 is formed, and openings reaching the electrode layers 150a to 150e are formed in the insulating layer 152. Then, a conductive layer is formed so as to fill the openings. After that, part of the conductive layer is removed by etching, CMP, or the like, whereby the insulating layer 152 is exposed and the electrode layers 154a, 154b, 154c, and 154d are formed (see FIG. 15D). This step is similar <Variations of Transistor>

FIG. 16, FIGS. 17A and 17B, FIGS. 18A and 18B, and FIGS. 19A and 19B each illustrate a variation of the structure of the transistor 164. That is, the structure of the transistor 160 is the same as the above.

Figure 16:
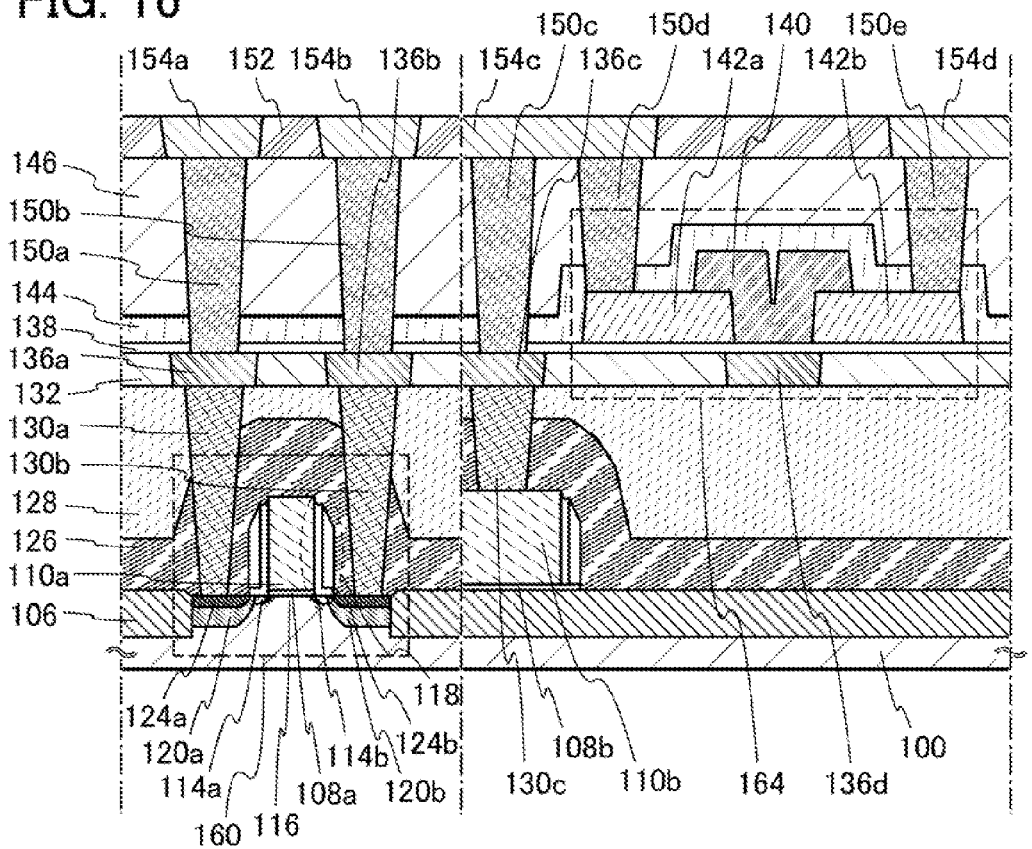
FIG. 16 illustrates a variation of a transistor.

FIG. 16 illustrates the transistor 164 in which the gate layer 136d is placed below the oxide semiconductor layer 140 and the end faces of the source layer 142a and the drain layer 142b are partly in contact with the oxide semiconductor layer 140.

A big difference between the structure in FIG. 16 and the structure in FIG. 12 is the position at which the oxide semiconductor layer 140 is connected to the source layer 142a and the drain layer 142b. That is, the end faces of the oxide semiconductor layer 140 are partly in contact with the source layer 142a and the drain layer 142b in the structure in FIG. 12, whereas the end faces of the source layer 142a and the drain layer 142b are partly in contact with the oxide semiconductor layer 140 in the structure in FIG. 16. Further, the difference in the contact position results in a different arrangement of other electrodes, insulating layers, and the like. Note that the details of each component are the same as those of FIG. 12.

Specifically, the transistor 164 illustrated in FIG. 16 includes the gate layer 136d provided over the interlayer insulating layer 128, the gate insulating film 138 provided over the gate layer 136d, the source layer 142a and the drain layer 142b provided over the gate insulating film 138, and the oxide semiconductor layer 140 in contact with upper surfaces of the source layer 142a and the drain layer 142b. In addition, over the transistor 164, the protective insulating layer 144 is provided so as to cover the oxide semiconductor layer 140.

Figure 17A:
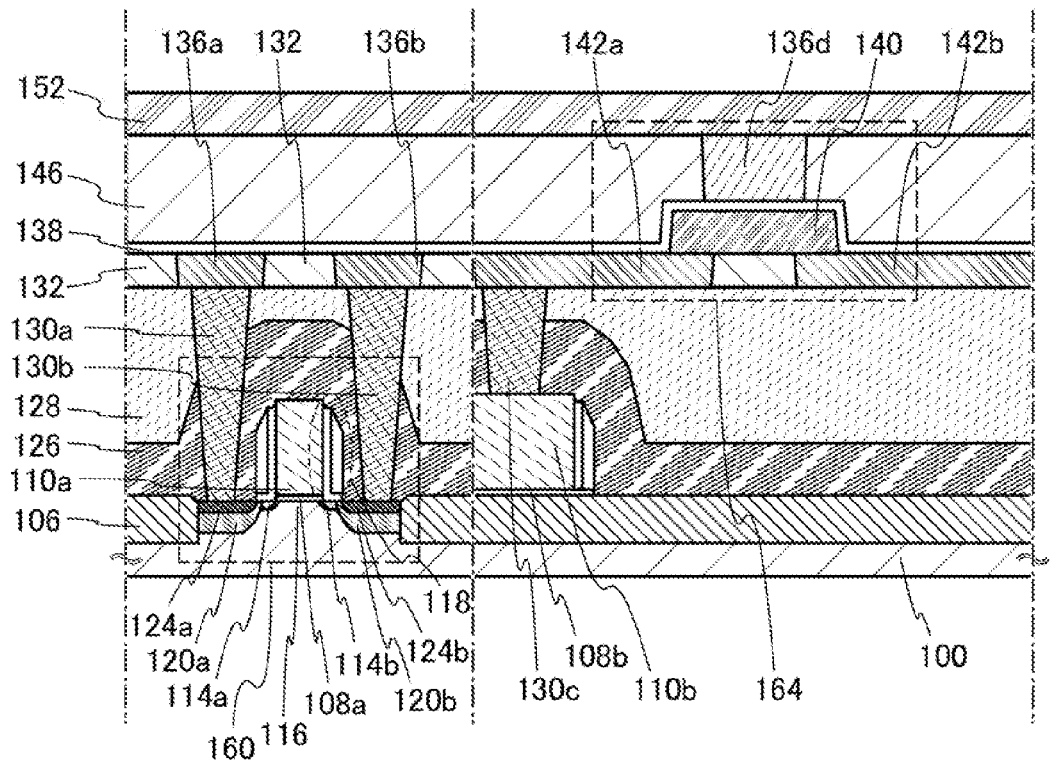
FIGS. 17A and 17B each illustrate a variation of a transistor.
Figure 17B:
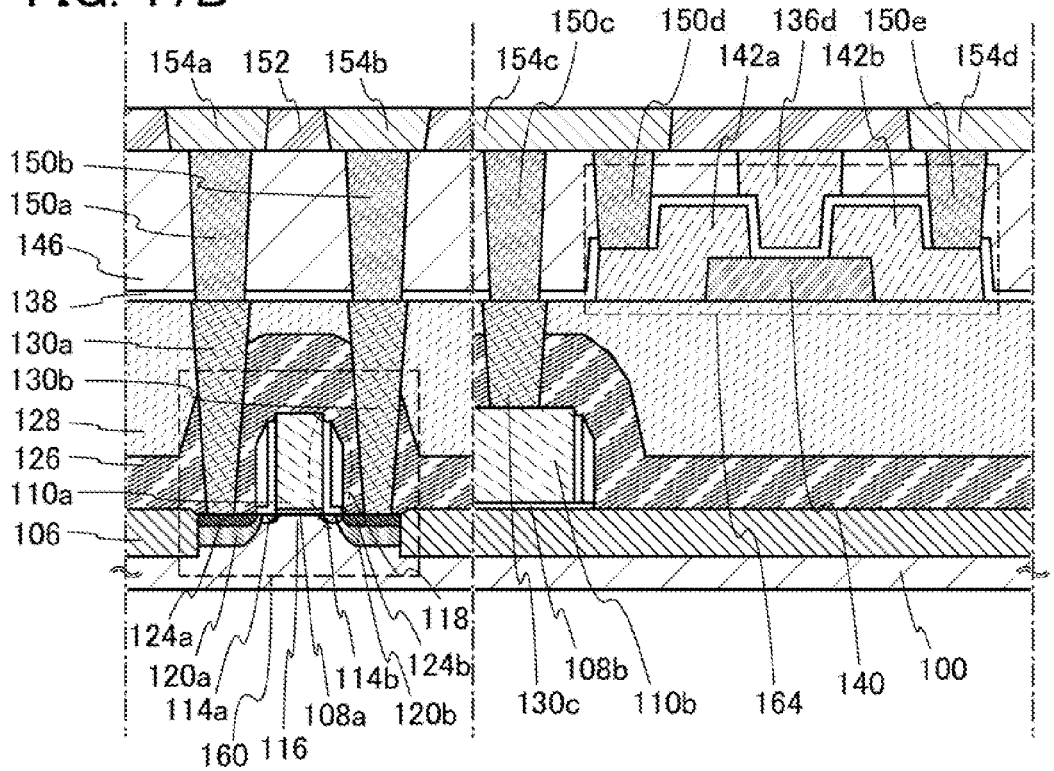

FIGS. 17A and 17B each illustrate the transistor 164 in which the gate layer 136d is provided over the oxide semiconductor layer 140. FIG. 17A illustrates an example of a structure in which the source layer 142a and the drain layer 142b are in contact with a bottom surface of the oxide semiconductor layer 140. FIG. 17B illustrates an example of a structure in which the source layer 142a and the drain layer 142b are in contact with an upper surface of the oxide semiconductor layer 140.

A big difference of the structures in FIGS. 17A and 17B from those in FIG. 12 and FIG. 16 is that the gate electrode layer 136d is placed over the oxide semiconductor layer 140. Furthermore, a big difference between the structure in FIG. 17A and the structure in FIG. 17B is that the source layer 142a and the drain layer 142b are in contact with either the bottom surface or the upper surface of the oxide semiconductor layer 140. These differences result in a different arrangement of other electrodes, insulating layers, and the like. The details of each component are the same as those of FIG. 12 and the like.

Specifically, the transistor 164 illustrated in FIG. 17A includes the source layer 142a and the drain layer 142b provided over the interlayer insulating layer 128, the oxide semiconductor layer 140 in contact with the upper surfaces of the source layer 142a and the drain layer 142b, the gate insulating film 138 provided over the oxide semiconductor layer 140, and the gate layer 136d provided over the gate insulating film 138 in a region overlapping with the oxide semiconductor layer 140.

The transistor 164 illustrated in FIG. 17B includes the oxide semiconductor layer 140 provided over the interlayer insulating layer 128; the source layer 142a and the drain layer 142b provided to be in contact with the upper surface of the oxide semiconductor layer 140; the gate insulating film 138 provided over the oxide semiconductor layer 140, the source layer 142a, and the drain layer 142b; and the gate layer 136d provided over the gate insulating film 138 in a region overlapping with the oxide semiconductor layer 140.

Note that in the structures in FIGS. 17A and 17B, a component (e.g., the electrode layer 150a or the electrode layer 154a) is sometimes omitted from the structure in FIG. 12 or the like. In that case, a secondary effect such as simplification of the fabrication process can be obtained. Needless to say, a nonessential component can be omitted in the structure in FIG. 12 and the like.

Figure 18A:
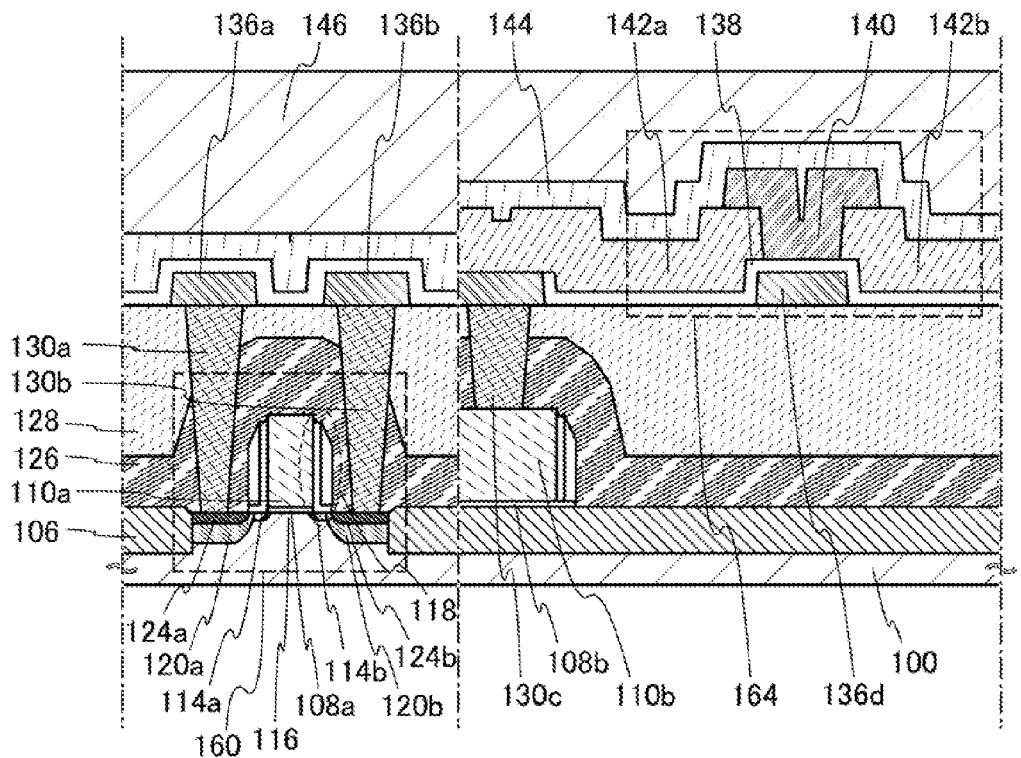
FIGS. 18A and 18B each illustrate a variation of a transistor.
Figure 18B:
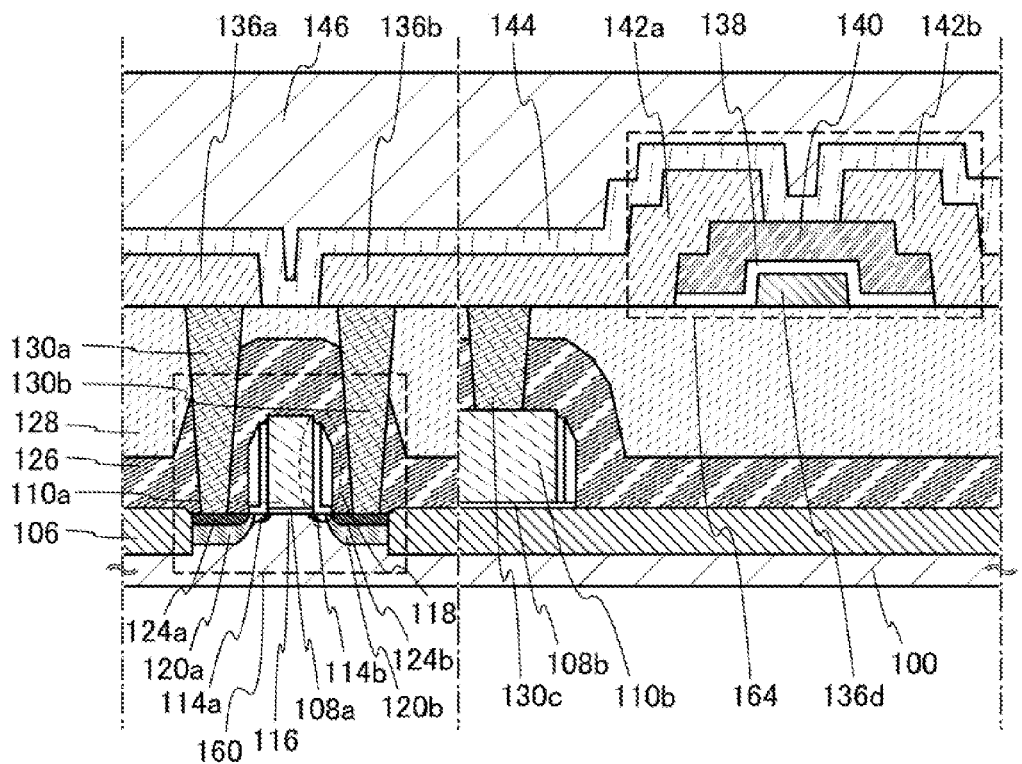

FIGS. 18A and 18B each illustrate the transistor 164 that is relatively large in size and includes the gate layer 136d placed below the oxide semiconductor layer 140. In that case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 18A and the structure in FIG. 18B is whether the source layer 142a and the drain layer 142b are in contact with parts of the end faces of the oxide semiconductor layer 140 or the end faces of the oxide semiconductor layer 140 are in contact with parts of the end faces of the source layer 142a and the drain layer 142b. The difference results in a different arrangement of other electrodes, insulating layers, and the like. The details of each component are the same as those of FIG. 12 and the like.

Specifically, the transistor 164 illustrated in FIG. 18A includes the gate layer 136d provided over the interlayer insulating layer 128, the gate insulating film 138 provided over the gate layer 136d, the source layer 142a and the drain layer 142b provided over the gate insulating film 138, and the oxide semiconductor layer 140 that is in contact with parts of the end faces of the source layer 142a and the drain layer 142b.

The transistor 164 illustrated in FIG. 18B includes the gate layer 136d provided over the interlayer insulating layer 128, the gate insulating film 138 provided over the gate layer 136d, the oxide semiconductor layer 140 provided over the gate insulating film 138 in a region overlapping with the gate layer 136d, and the source layer 142a and the drain layer 142b that are in contact with the end faces of the oxide semiconductor layer 140.

Note that also in the structures illustrated in FIGS. 18A and 18B, a component is sometimes omitted from the structure in FIG. 12 or the like. In that case, a secondary effect such as simplification of the fabrication process can be obtained.

Figure 19A:
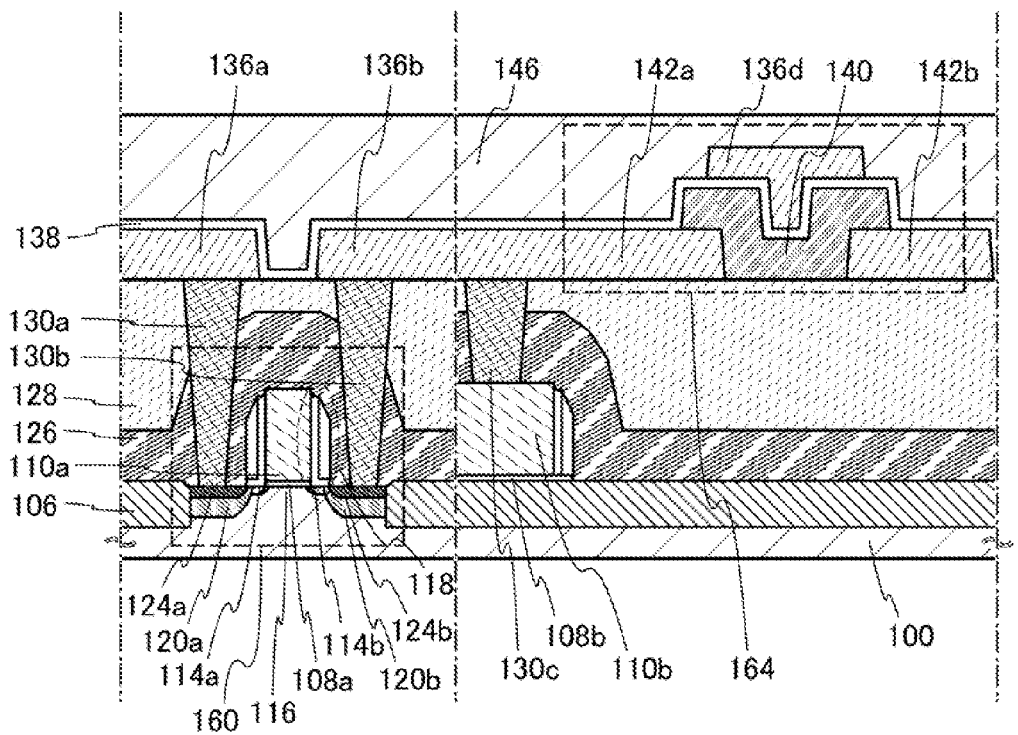
FIGS. 19A and 19B each illustrate a variation of a transistor.
Figure 19B:
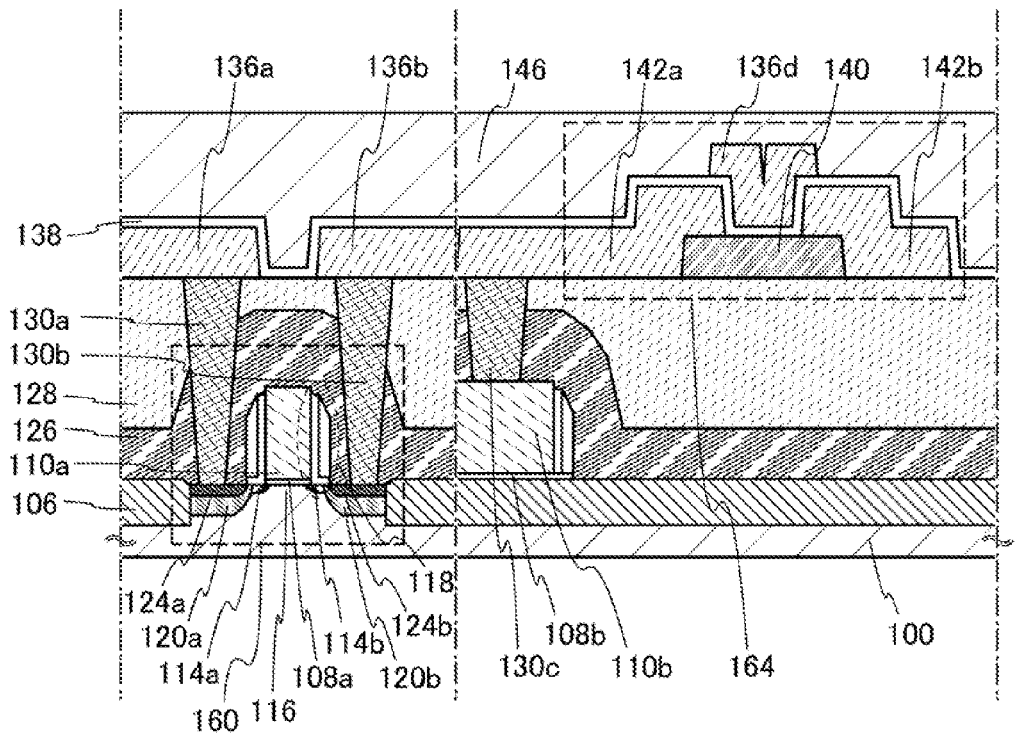

FIGS. 19A and 19B each illustrate the transistor 164 that is relatively large in size and includes the gate layer 136d placed over the oxide semiconductor layer 140. Also in that case, a demand for the planarity of a surface and the coverage is relatively moderate, so that it is not necessary to form a wiring, an electrode, and the like to be embedded in an insulating layer. For example, the gate layer 136d and the like can be formed by patterning after formation of a conductive layer.

A big difference between the structure in FIG. 19A and the structure in FIG. 19B is whether the source layer 142a and the drain layer 142b are in contact with parts of the end faces of the oxide semiconductor layer 140 or the end faces of the oxide semiconductor layer 140 are in contact with parts of the end faces of the source layer 142a and the drain layer 142b. The difference results in a different arrangement of other electrodes, insulating layers, and the like. The details of each component are the same as those of FIG. 12 and the like.

Specifically, the transistor 164 illustrated in FIG. 19A includes the source layer 142a and the drain layer 142b provided over the interlayer insulating layer 128; the oxide semiconductor layer 140 in contact with the end faces of the source layer 142a and the drain layer 142b; the gate insulating film 138 provided over the source layer 142a, the drain layer 142b, and the oxide semiconductor layer 140; and the gate layer 136d provided over the gate insulating film 138 in a region overlapping with the oxide semiconductor layer 140.

The transistor 164 illustrated in FIG. 19B includes the oxide semiconductor layer 140 provided over the interlayer insulating layer 128; the source layer 142a and the drain layer 142b provided to be in contact with the end faces of the oxide semiconductor layer 140; the gate insulating film 138 provided over the source layer 142a, the drain layer 142b, and the oxide semiconductor layer 140; and the gate layer 136d provided over the gate insulating film 138. Note that the gate layer 136d is provided in a region overlapping with the oxide semiconductor layer 140 with the gate insulating film 138 placed therebetween.

Note that also in the structures illustrated in FIGS. 19A and 19B, a component is sometimes omitted from the structure in FIG. 12 or the like. Also in that case, a secondary effect such as simplification of the fabrication process can be obtained.

Figure 20:
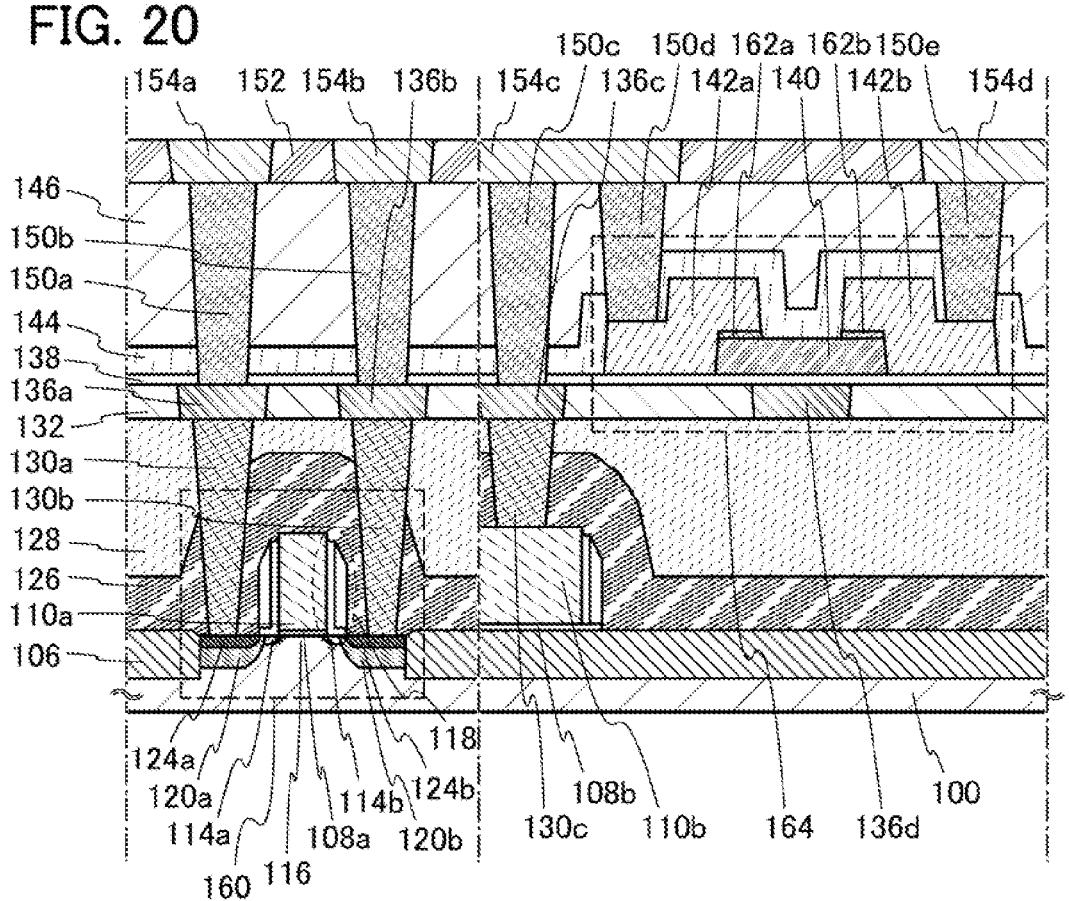
FIG. 20 illustrates a variation of a transistor.
Figure 21:
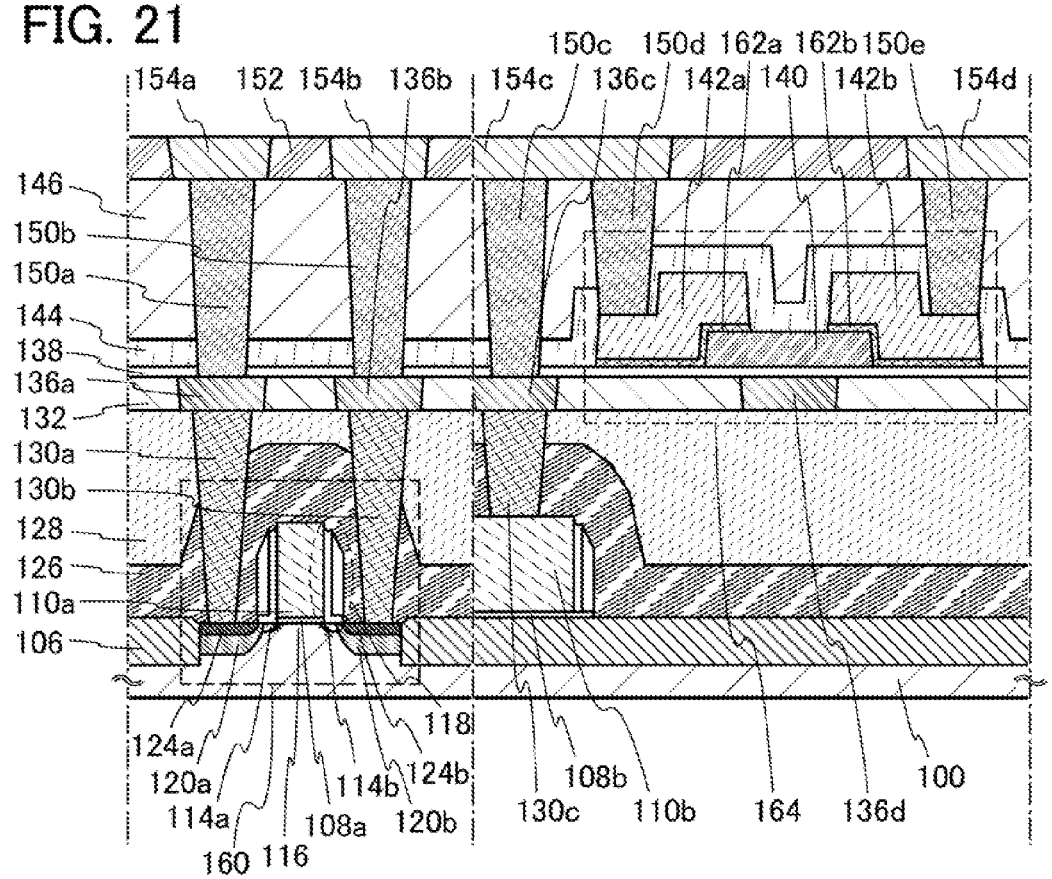
FIG. 21 illustrates a variation of a transistor.

Oxide conductive layers functioning as a source region and a drain region may be provided as buffer layers between the oxide semiconductor layer 140 and the source and drain layers 142a and 142b which are illustrated in FIG. 12. FIG. 20 and FIG. 21 each illustrate a transistor obtained by providing the oxide conductive layers in the transistor 164 in FIG. 12.

In the transistors 164 illustrated in FIG. 20 and FIG. 21, oxide conductive layers 162a and 162b functioning as a source region and a drain region are formed between the oxide semiconductor layer 140 and the source and drain layers 142a and 142b. A difference between the transistor 164 in FIG. 20 and that in FIG. 21 is that the shape of the oxide conductive layers 162a and 162b is different depending on the formation step.

In the transistor 164 in FIG. 20, a stack of an oxide semiconductor layer and an oxide conductive layer is formed and processed by one photolithography process, so that the island-shaped oxide semiconductor layer 140 and the island-shaped oxide conductive layer are formed. Then, the source layer 142a and the drain layer 142b are formed over the oxide semiconductor layer and the oxide conductive layer. After that, the island-shaped oxide conductive layer is etched using the source layer 142a and the drain layer 142b as masks, so that the oxide conductive layers 162a and 162b serving as a source region and a drain region are formed.

In the transistor 164 in FIG. 21, an oxide conductive layer is formed over the oxide semiconductor layer 140, and a metal conductive layer is formed thereover. Then, the oxide conductive layer and the metal conductive layer are processed by one photolithography process, thereby forming the oxide conductive layers 162a and 162b serving as a source region and a drain region, the source layer 142a, and the drain layer 142b.

For etching treatment for processing the shape of the oxide conductive layer, the etching conditions (e.g., the kind and concentration of etching gas or etchant, and etching time) are adjusted as appropriate to prevent excessive etching of the oxide semiconductor layer.

As the method for forming the oxide conductive layers 162a and 162b, sputtering, vacuum evaporation (e.g., electron beam evaporation), arc discharge ion plating, or spray coating is used. As a material for the oxide conductive layers, zinc oxide, zinc aluminum oxide, zinc aluminum oxynitride, zinc gallium oxide, indium tin oxide, or the like can be used. In addition, the above materials may contain silicon oxide.

By providing the oxide conductive layers as the source region and the drain region between the oxide semiconductor layer 140 and the source and drain layers 142a and 142b, the resistance of the source region and the drain region can be decreased and the transistor 164 can operate at high speed.

Further, such a structure can increase the withstand voltage of the transistor 164.

Note that FIG. 20 and FIG. 21 illustrate the structure in which the oxide conductive layers are provided between the oxide semiconductor layer 140 and the source and drain layers 142a and 142b in the transistor 164 illustrated in FIG. 12. Alternatively, the oxide conductive layers can be provided between the oxide semiconductor layer 140 and the source and drain layers 142a and 142b in the transistors 164 illustrated in FIG. 16, FIGS. 17A and 17B, FIGS. 18A and 18B, and FIGS. 19A and 19B.

Note that the examples in which the transistor 164 is stacked over the transistor 160 are described here; however, the arrangement of the transistors 160 and 164 is not limited to these examples. For example, the transistor 160 and the transistor 164 can be formed over one surface. Further, the transistor 160 and the transistor 164 may be provided to overlap with each other.

<Variation of Step for Forming Oxide Semiconductor Layer>

Figure 22A:
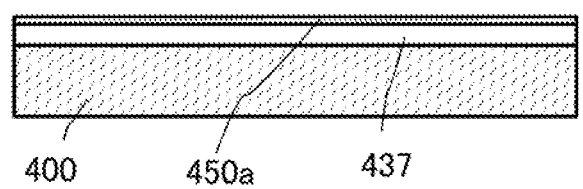
FIGS. 22A to 22C illustrate a variation of steps for forming an oxide semiconductor layer.
Figure 22B:
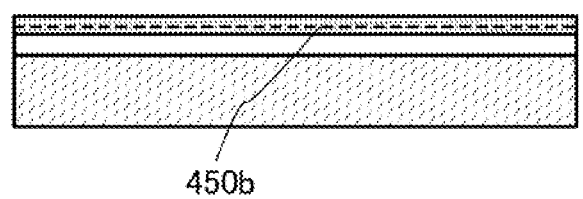

A step for forming an oxide semiconductor layer, which is different from that in the process for forming the above-described transistor, will be described with reference to FIGS. 22A to 22C.

The oxide semiconductor layer includes a first crystalline oxide semiconductor layer and a second crystalline oxide semiconductor layer that is placed over the first crystalline oxide semiconductor layer and is thicker than the first crystalline oxide semiconductor layer.

An insulating layer 437 is formed over an insulating layer 400. Here, as the insulating layer 437, an oxide insulating layer with a thickness of 50 nm to 600 nm is formed by PECVD or sputtering. For example, the oxide insulating layer can be one layer or a stack of layers selected from a silicon oxide layer, a gallium oxide layer, an aluminum oxide layer, a silicon oxynitride layer, an aluminum oxynitride layer, and a silicon nitride oxide layer.

Next, a first oxide semiconductor layer with a thickness of 1 nm to 10 nm is formed over the insulating layer 437. The first oxide semiconductor layer is formed by sputtering. The substrate temperature at the time when the first oxide semiconductor layer is deposited by sputtering is 200° C. to 400° C.

Here, a 5-nm-thick first oxide semiconductor layer is formed using a metal oxide target (an In—Ga—Zn—O-based metal oxide target with a composition ratio of $In_2O_3:Ga_2O_3:ZnO=1:1:2$ [molar ratio]) under the following conditions: the distance between the substrate and the target is 170 mm, the substrate temperature is 250° C., the pressure is 0.4 Pa, the direct-current (DC) power is 0.5 kW, and the atmosphere is an oxygen atmosphere, an argon atmosphere, or an atmosphere containing argon and oxygen.

Next, the atmosphere in the chamber in which the substrate is put is set to a nitrogen atmosphere or dry air, and first heat treatment is performed. The temperature of the first heat treatment ranges from 400° C. to 750° C. With the first heat treatment, a first crystalline oxide semiconductor layer 450a is formed (see FIG. 22A).

Although depending on the substrate temperature at the time of deposition or the temperature of the first heat treatment, the deposition or the first heat treatment causes crystallization from the film surface and crystals grow from the surface toward the inside, so that c-axis-oriented crystals are obtained. With the first heat treatment, large amounts of zinc and oxygen gather at the film surface, one or a plurality of layers of a graphene-like two-dimensional crystal that is made of zinc and oxygen and has a hexagonal lattice on the top plane is/are formed on the uppermost surface, and the two-dimensional crystal overlaps one another to form a stack. When the temperature of the heat treatment is raised, crystal growth progresses from the surface to the inside and then from the inside to the bottom.

With the first heat treatment, oxygen in the insulating layer 437, which is the oxide insulating layer, is diffused into the interface between the first crystalline oxide semiconductor layer 450a and the insulating layer 437 or the vicinity of the interface (within the range of ±5 nm from the interface) to reduce oxygen vacancies in the first crystalline oxide semiconductor layer 450a. Therefore, in the insulating layer 437 used as a base insulating layer, oxygen that is larger in proportion than the stoichiometric proportion preferably exists at least one of in the layer (in the bulk) and at the interface between the first crystalline oxide semiconductor layer 450a and the insulating layer 437.

Next, a second oxide semiconductor layer that is thicker than 10 nm is formed over the first crystalline oxide semiconductor layer 450a. The second oxide semiconductor layer is formed by sputtering at the substrate temperature of 200° C. to 400° C., in which case precursors are aligned in the second oxide semiconductor layer deposited to be on and in contact with a surface of the first crystalline oxide semiconductor layer, and the second oxide semiconductor layer can thus have a crystalline order.

Here, a 25-nm-thick second oxide semiconductor layer is formed using a metal oxide target (an In—Ga—Zn—O-based metal oxide target with a composition ratio of $In_2O_3:Ga_2O_3:ZnO=1:1:2$ [molar ratio]) under the following conditions: the distance between the substrate and the target is 170 mm, the substrate temperature is 400° C., the pressure is 0.4 Pa, the direct-current (DC) power is 0.5 kW, and the atmosphere is an oxygen atmosphere, an argon atmosphere, or an atmosphere containing argon and oxygen.

Next, the atmosphere in the chamber in which the substrate is put is set to a nitrogen atmosphere or dry air, and second heat treatment is performed. The temperature of the second heat treatment ranges from 400° C. to 750° C. With the second heat treatment, a second crystalline oxide semiconductor layer 450b is formed (see FIG. 22B). The second heat treatment is performed in a nitrogen atmosphere, an oxygen atmosphere, or a mixed atmosphere of nitrogen and oxygen to increase the density of the second crystalline oxide semiconductor layer and reduce defects. With the second heat treatment, crystal growth progresses in the thickness direction, that is, from the bottom to the inside, with the first crystalline oxide semiconductor layer 450a as a nucleus; thus, the second crystalline oxide semiconductor layer 450b is formed.

It is preferable to perform the steps from the formation of the insulating layer 437 to the second heat treatment successively without exposure to the air. The steps from the formation of the insulating layer 437 to the second heat treatment are preferably performed in an atmosphere that hardly contains hydrogen and moisture (e.g., an inert atmosphere, a reduced pressure atmosphere, or a dry air atmosphere). For example, a dry nitrogen atmosphere with a dew point of −40° C. or lower, preferably −50° C. or lower is used.

Figure 22C:
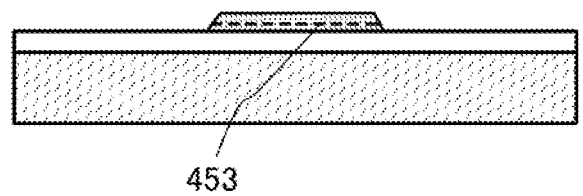

Next, the oxide semiconductor stack including the first crystalline oxide semiconductor layer 450a and the second crystalline oxide semiconductor layer 450b is processed so that an oxide semiconductor layer 453 made of the island-shaped oxide semiconductor stack is formed (see FIG. 22C). In FIGS. 22B and 22C, the interface between the first crystalline oxide semiconductor layer 450a and the second crystalline oxide semiconductor layer 450b is shown by doted lines to indicate the oxide semiconductor stack; a clear interface does not exist and FIGS. 22B and 22C show the interface for easy understanding.

The oxide semiconductor stack can be processed by etching after a mask with a desired shape is formed over the oxide semiconductor stack. The mask may be formed by photolithography, ink-jet printing, or the like.

For the etching of the oxide semiconductor stack, either wet etching or dry etching can be employed. Needless to say, both of them may be employed in combination.

The first and second crystalline oxide semiconductor layers obtained by the above formation method have c-axis alignment. Note that the first and second crystalline oxide semiconductor layers include an oxide including a crystal with c-axis alignment (also referred to as a c-axis aligned crystal (CAAC)), which has neither a single crystal structure nor an amorphous structure.

The first and second crystalline oxide semiconductor layers are formed using, for example, an oxide of four metal elements, such as an In—Sn—Ga—Zn—O-based material; an oxide of three metal elements, such as an In—Ga—Zn—O-based material (also referred to as IGZO), an In—Sn—Zn—O-based material (also referred to as ITZO), an In—Al—Zn—O-based material, a Sn—Ga—Zn—O-based material, an Al—Ga—Zn—O-based material, a Sn—Al—Zn—O-based material, an In—Hf—Zn—O-based material, an In—La—Zn—O-based material, an In—Ce—Zn—O-based material, an In—Pr—Zn—O-based material, an In—Nd—Zn—O-based material, an In—Sm—Zn—O-based material, an In—Eu—Zn—O-based material, an In—Gd—Zn—O-based material, an In—Tb—Zn—O-based material, an In—Dy—Zn—O-based material, an In—Ho—Zn—O-based material, an In—Er—Zn—O-based material, an In—Tm—Zn—O-based material, an In—Yb—Zn—O-based material, or an In—Lu—Zn—O-based material; an oxide of two metal elements, such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or an oxide of one metal element, such as an In—O-based material, a Sn—O-based material, or a Zn—O-based material. In addition, the above material may contain $SiO_2$. Here, for example, an In—Ga—Zn—O-based material means an oxide containing indium (In), gallium (Ga), and zinc (Zn), and there is no particular limitation on the composition ratio. Further, the In—Ga—Zn—O-based material may contain an element other than In, Ga, and Zn.

Without limitation to the two-layer structure in which the second crystalline oxide semiconductor layer is formed over the first crystalline oxide semiconductor layer, it is possible to employ a stacked structure including three or more layers, by conducting or repeating the steps of deposition and heat treatment for forming a third crystalline oxide semiconductor layer after the formation of the second crystalline oxide semiconductor layer.

A highly reliable transistor with stable electrical characteristics can be realized by using a stack of a first crystalline oxide semiconductor layer and a second crystalline oxide semiconductor layer like the oxide semiconductor layer 453.

<Application Example of Semiconductor Storage Device>

Figure 23:
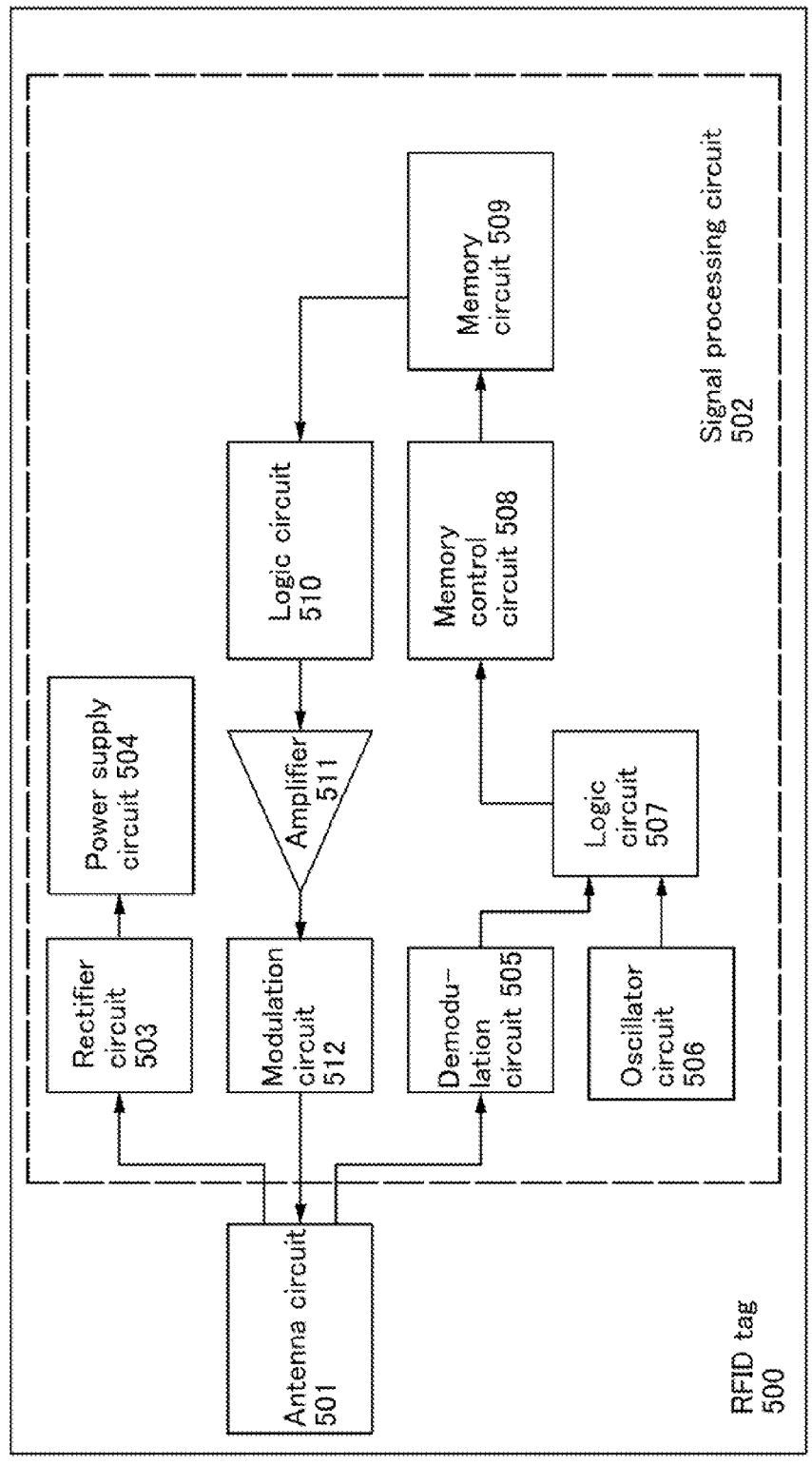
FIG. 23 illustrates an application example of a semiconductor storage device.

A radio frequency identification (RFID) tag 500 will be described below as an application example of the semiconductor storage device (see FIG. 23).

The RFID tag 500 includes an antenna circuit 501 and a signal processing circuit 502. The signal processing circuit 502 includes a rectifier circuit 503, a power supply circuit 504, a demodulation circuit 505, an oscillator circuit 506, a logic circuit 507, a memory control circuit 508, a memory circuit 509, a logic circuit 510, an amplifier 511, and a modulation circuit 512. The memory circuit 509 includes the above-described semiconductor storage device.

Communication signals received by the antenna circuit 501 are input to the demodulation circuit 505. The frequency of the communication signals received, that is, signals transmitted and received between the antenna circuit 501 and a reader/writer is 915 MHz and 2.45 GHz, for example, in the ultra high frequency (UHF) band, which are determined on the basis of the ISO standards or the like. Needless to say, the frequency of signals transmitted and received between the antenna circuit 501 and the reader/writer is not limited to the above, and any of the following frequencies can be used, for example: tremendously high frequency (300 GHz to 3 THz), extremely high frequency (30 GHz to 300 GHz), super high frequency (3 GHz to 30 GHz), ultra high frequency (300 MHz to 3 GHz), and very high frequency (30 MHz to 300 MHz). In addition, signals transmitted and received between the antenna circuit 501 and the reader/writer are signals obtained through carrier modulation. A carrier wave is modulated by analog modulation or digital modulation, and any of amplitude modulation, phase modulation, frequency modulation, and spread spectrum may be used. It is preferable to use amplitude modulation or frequency modulation.

An oscillation signal output from the oscillator circuit 506 is supplied as a clock signal to the logic circuit 507. Further, the modulated carrier wave is demodulated in the demodulation circuit 505. The demodulated signal is transmitted to the logic circuit 507 and analyzed. The signal analyzed in the logic circuit 507 is transmitted to the memory control circuit 508. The memory control circuit 508 controls the memory circuit 509, takes out data stored in the memory circuit 509, and transmits the data to the logic circuit 510. The logic circuit 510 encodes the data. Then, the encoded data is amplified in the amplifier 511. The modulation circuit 512 modulates carrier waves in accordance with the amplified data. The reader/writer recognizes the signal from the RFID tag 500 with the modulated carrier wave.

Carrier waves input to the rectifier circuit 503 are rectified and then input to the power supply circuit 504. Power supply voltage obtained in this manner is supplied from the power supply circuit 504 to the demodulation circuit 505, the oscillator circuit 506, the logic circuit 507, the memory control circuit 508, the memory circuit 509, the logic circuit 510, the amplifier 511, the modulation circuit 512, and the like.

There is no particular limitation on the connection between the signal processing circuit 502 and an antenna in the antenna circuit 501. For example, the antenna and the signal processing circuit 502 are connected by wire bonding or bump connection. Alternatively, the signal processing circuit 502 is formed in a chip shape and one surface thereof is used as an electrode and attached to the antenna. The signal processing circuit 502 and the antenna can be attached to each other with an anisotropic conductive film (ACF).

The antenna is stacked over the same substrate as the signal processing circuit 502 or formed as an external antenna. Needless to say, the antenna is provided above or below the signal processing circuit.

The rectifier circuit 503 converts AC signals that are induced by carrier waves received by the antenna circuit 501 into DC signals.

Figure 24:
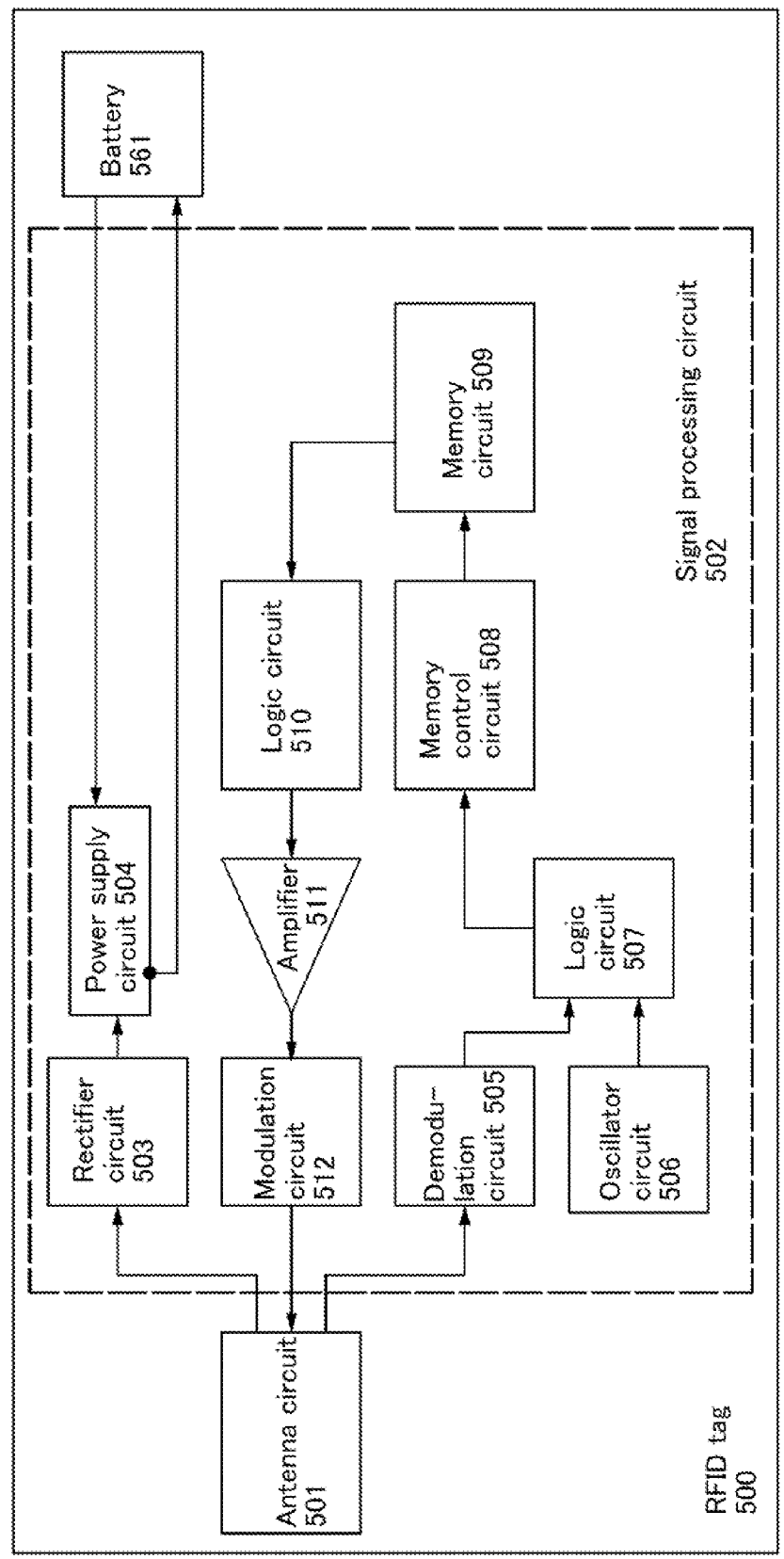
FIG. 24 illustrates an application example of a semiconductor storage device.

The RFID tag 500 may include a battery 561 (see FIG. 24). When power supply voltage output from the rectifier circuit 503 is not high enough to operate the signal processing circuit 502, the battery 561 also supplies power supply voltage to the circuits included in the signal processing circuit 502 (e.g., the demodulation circuit 505, the oscillator circuit 506, the logic circuit 507, the memory control circuit 508, the memory circuit 509, the logic circuit 510, the amplifier 511, and the modulation circuit 512).

Surplus voltage of the power supply voltage output from the rectifier circuit 503 may be stored in the battery 561. When an antenna circuit and a rectifier circuit are provided in the RFID tag 500 in addition to the antenna circuit 501 and the rectifier circuit 503, energy to be stored in the battery 561 can be obtained from electromagnetic waves and the like that are generated randomly.

A battery can be continuously used by charging. As the battery, a battery formed into a sheet form is used. A reduction in the size of the battery can be realized by using a lithium polymer battery including a gel electrolyte, a lithium ion battery, or a lithium secondary battery, for example. Moreover, a nickel metal hydride battery, a nickel cadmium battery, or a capacitor with large capacitance can be used, for example.

Figure 25A:
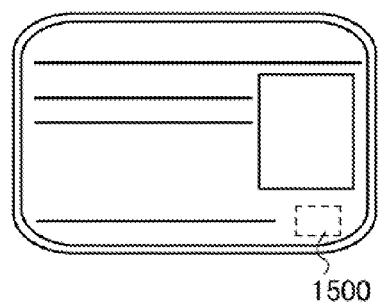
FIGS. 25A to 25F each illustrate an application example of a semiconductor storage device.
Figure 25B:
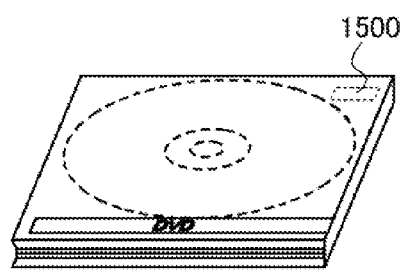
Figure 25C:
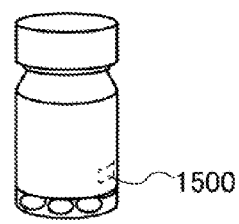
Figure 25D:
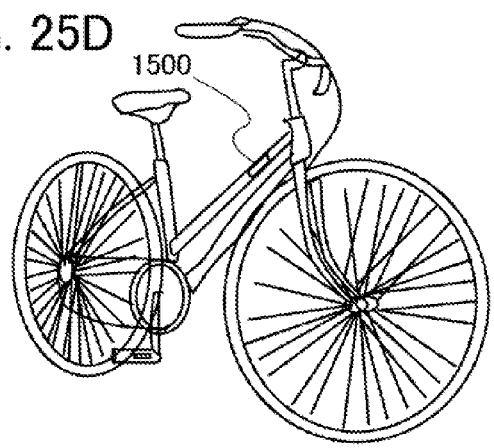
Figure 25E:
Figure 25F:
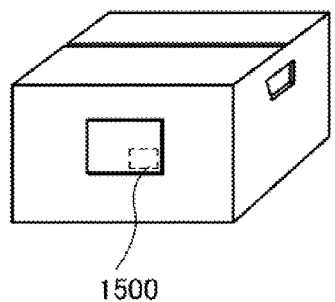

As illustrated in FIGS. 25A to 25F, the RFID tag is widely used by being provided for, for example, products such as bills, coins, securities, bearer bonds, documents (e.g., driver's licenses and resident's cards, see FIG. 25A), storage media (e.g., DVD software and video tapes, see FIG. 25B), packaging containers (e.g., wrapping paper and bottles, see FIG. 25C), vehicles (e.g., bicycles, see FIG. 25D), personal belongings (e.g., bags and glasses), foods, plants, animals, human bodies, clothes, household goods, and electronic appliances (e.g., liquid crystal display devices, EL display devices, television receivers, and mobile phones) and tags on products (see FIGS. 25E and 25F).

An RFID tag 1500 is fixed to a product by being mounted on a printed board, being attached to a surface of the product, or being embedded in the product. For example, the RFID tag 1500 is incorporated in paper of a book or an organic resin package to be fixed to each object. Since the RFID tag 1500 can be small, thin, and lightweight, it can be fixed to a product without spoiling the design of the product. Further, an authentication function can be obtained by providing the RFID tag 1500 for bills, coins, securities, bearer bonds, documents, and the like. With the authentication function, counterfeiting can be prevented. Further, when the RFID tag 1500 is attached to packaging containers, storage media, personal belongings, foods, clothes, household goods, electronic appliances, or the like, a system such as an inspection system can be efficiently used. When the RFID tag 1500 is attached to vehicles, the level of security against theft or the like can be raised.

By using the semiconductor storage device for various applications as described above, data used for exchanging information can be kept accurate value. Thus, authenticity or security of an object can be improved.

This application is based on Japanese Patent Application serial No. 2010-281574 filed with Japan Patent Office on Dec. 17, 2010, the entire contents of which are hereby incorporated by reference.

What is claimed is:
1. A semiconductor storage device comprising:
  a memory cell array including a plurality of memory cells arranged in matrix, each one of the plurality of memory cells comprises a first transistor comprising a channel region formed with an oxide semiconductor;
  a decoder operationally connected with the plurality of memory cells; and a first circuit operationally connected with the decoder, the
first circuit comprising a first element, a second element,
a third element, a first line, a second line, a third line, and
a fourth line,
wherein:
the first line is electrically connected to a first input of the
first element, a first input of the second element, and a
first input of the third element;
the second line is electrically connected to a second
input of the first element;
the third line is electrically connected to a second input
of the second element;
the fourth line is electrically connected to a second input
of the third element;
in each of the plurality of memory cells, data is held by
turning off the first transistor;
the semiconductor storage device is configured to transmit an address signal through the second line;
the semiconductor storage device is configured to transmit a read enable signal through the third line;
the semiconductor storage device is configured to transmit a write enable signal through the fourth line;
the address signal, the read enable signal, and the write
enable signal are different from each other;
the first circuit does not output the address signal in a
given period after power supply starts, and the first
circuit outputs the address signal after the given
period passes;
each one of the first element, the second element, and the
third element is a switch, and the switch is controlled
with a reset signal transmitted through the first line;
the address signal is supplied to the decoder through the
switch; and
the switch is turned off by setting the reset signal at a
ground potential in the given period.

2. The semiconductor storage device according to claim 1,
wherein:
the first element is a first AND gate;
the second element is a second AND gate; and
the third element is a third AND gate.

3. The semiconductor storage device according to claim 1,
further comprising:
a capacitor provided in each of the plurality of memory
cells, the capacitor having electrodes one of which is
electrically connected to one of a source and a drain of
the first transistor,
wherein the data is read out by judging an amount of charge
stored in the capacitor.

4. The semiconductor storage device according to claim 1,
further comprising:
a second transistor provided in each of the plurality of
memory cells, the second transistor comprising a gate
electrically connected to one of a source and a drain of
the first transistor,
wherein the data is read out by judging a conduction state
of the second transistor.

5. The semiconductor storage device according to claim 1,
further comprising:
a capacitor provided in each of the plurality of memory
cells, the capacitor having electrodes one of which is
electrically connected to the one of a source and a drain
of the first transistor and a gate of a second transistor and
the other of which is electrically connected to a reading
word line,
wherein one of a source and a drain of the second transistor
is electrically connected to a reading bit line, and the
other of the source and the drain of the second transistor
is electrically connected to a wiring supplying a fixed
potential.

6. The semiconductor storage device according to claim 1,
further comprising:
a capacitor provided in each of the plurality of memory
cells, the capacitor having electrodes one of which is
electrically connected to the one of a source and a drain
of the first transistor and a gate of a second transistor and
the other of which is electrically connected to a reading
word line,
wherein:
in n memory cells arranged in a column direction among
the plurality of memory cells, where n is a natural
number greater than or equal to 3, one of the source
and the drain of the second transistor in a k-th memory
cell, where k is a natural number greater than or equal
to 2 and less than n, is electrically connected to the
other of the source and the drain of the second transistor in a (k-1)th memory cell, and the other of the
source and the drain of the second transistor in the k-th
memory cell is electrically connected to one of the
source and the drain of the second transistor in a
(k+1)th memory cell;
one of the source and the drain of the second transistor in
a first memory cell among the n memory cells
arranged in the column direction is electrically connected to a wiring supplying a fixed potential; and
the other of the source and the drain of the second transistor in an n-th memory cell among the n memory
cells arranged in the column direction is electrically
connected to a reading bit line.

7. The semiconductor storage device according to claim 1,
wherein the first circuit is configured to output the read enable
signal.

8. The semiconductor storage device according to claim 1,
wherein:
the first circuit is configured to output the address signal,
and
the first circuit is configured to output the write enable
signal.

9. A semiconductor storage device comprising:
a memory cell array including a plurality of memory cells
arranged in matrix;
a decoder operationally connected with the plurality of
memory cells; and
a first circuit operationally connected with the decoder, the
first circuit comprising a first element, a second element,
a third element, a first line, a second line, a third line, and
a fourth line,
wherein:
the first line is electrically connected to a first input of the
first element, a first input of the second element, and a
first input of the third element;
the second line is electrically connected to a second
input of the first element;
the third line is electrically connected to a second input
of the second element;
the fourth line is electrically connected to a second input
of the third element;
the semiconductor storage device is configured to transmit an address signal through the second line;
the semiconductor storage device is configured to transmit a read enable signal through the third line;
the semiconductor storage device is configured to transmit a write enable signal through the fourth line;

the address signal, the read enable signal, and the write enable signal are different from each other;

the first circuit does not output the address signal in a given period after power supply starts, and the first circuit outputs the address signal after the given period passes;

each one of the first element, the second element, and the third element is a switch, and the switch is controlled with a reset signal transmitted through the first line;

the address signal is supplied to the decoder through the switch; and the switch is turned off by setting the reset signal at a ground potential in the given period.

10. The semiconductor storage device according to claim 9, wherein:

the first element is a first AND gate;

the second element is a second AND gate; and the third element is a third AND gate.

11. The semiconductor storage device according to claim 9, wherein the first circuit is configured to output the read enable signal.

12. The semiconductor storage device according to claim 9, wherein:

the first circuit is configured to output the address signal, and the first circuit is configured to output the write enable signal.

* * * * *